(12) United States Patent
Nishimura et al.

(10) Patent No.: US 8,023,541 B2
(45) Date of Patent: Sep. 20, 2011

(54) OPTICAL TRANSMISSION CIRCUIT

(75) Inventors: Kazuko Nishimura, Kyoto (JP); Hiroshi Kimura, Hyogo (JP)

(73) Assignee: Panasonic Corporation, Osaka (JP)

( * ) Notice: Subject to any disclaimer, the term of this patent is extended or adjusted under 35 U.S.C. 154(b) by 745 days.

(21) Appl. No.: 12/093,076

(22) PCT Filed: Sep. 13, 2006

(86) PCT No.: PCT/JP2006/318191
§ 371 (c)(1),
(2), (4) Date: May 8, 2008

(87) PCT Pub. No.: WO2007/102236
PCT Pub. Date: Sep. 13, 2007

(65) Prior Publication Data
US 2009/0135866 A1    May 28, 2009

(30) Foreign Application Priority Data
Mar. 9, 2006   (JP) .................. 2006-063928

(51) Int. Cl.
*H01S 3/00* (2006.01)
*H01S 3/04* (2006.01)
(52) U.S. Cl. .......................... 372/34; 372/33
(58) Field of Classification Search ........... 372/33, 372/34
See application file for complete search history.

(56) References Cited

U.S. PATENT DOCUMENTS
5,043,992 A    8/1991   Royer et al.

FOREIGN PATENT DOCUMENTS

| EP | 1 085 624 A1 | 3/2001 |
|---|---|---|
| EP | 1085624 * | 3/2001 |
| JP | 3-133187 | 6/1991 |
| JP | 10-284791 | 10/1998 |
| JP | 2002-246687 | 8/2002 |
| JP | 2002246687 * | 8/2002 |
| JP | 2005-27130 | 1/2005 |

OTHER PUBLICATIONS

Kajita, M., et al., "Temperature Characteristic of a Vertical-Cavity Surface-Emitting Laser with a Braod-Gain Bandwidth", IEEE Journal of Selected Topics in Quantum Electronics, Jun. 1995, pp. 654-660, vol. 1 No. 2, IEEE.

* cited by examiner

*Primary Examiner* — Armando Rodriguez
(74) *Attorney, Agent, or Firm* — McDermott Will & Emery LLP

(57) ABSTRACT

An optical transmission circuit includes a light emitting device (10) having different temperature characteristics at low temperature and high temperature (e.g., a VCSEL (Vertical Cavity Surface Emitting Laser), differential switch transistors (M1, M2) for driving the light emitting device (10), the differential switch transistors having sources connected to each other and drains connected to the light emitting device (10) and a power supply, respectively, a bias current source (11) for causing a bias current to flow, a modulated current source (12) for causing a modulated current to flow, and a temperature compensation current source (20) for controlling currents of the bias current source (11) and the modulated current source (12) so as to compensate for both temperature characteristics at low temperature and temperature characteristics at high temperature of the light emitting device (10).

20 Claims, 17 Drawing Sheets

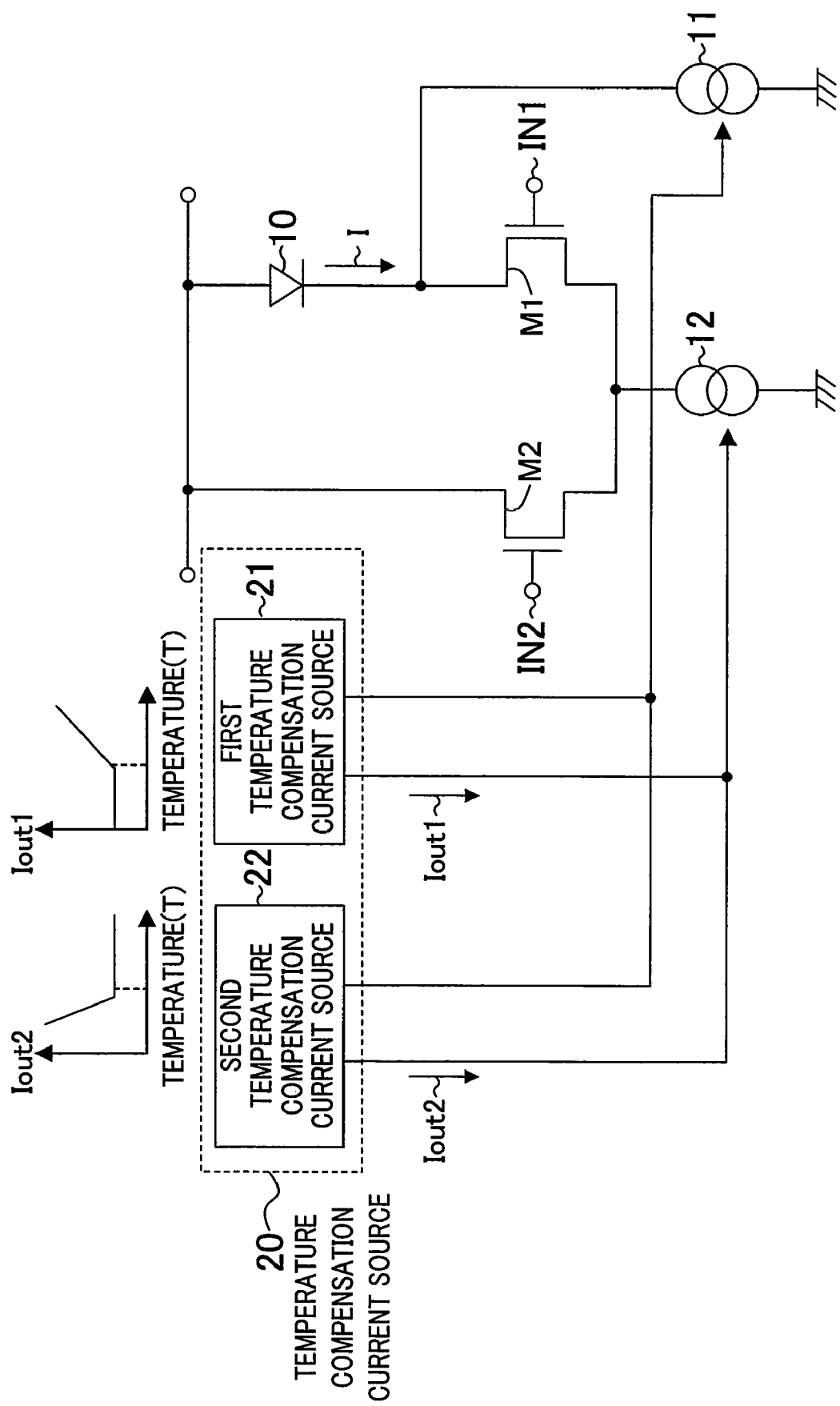

T1<T2<T3<T4<T5

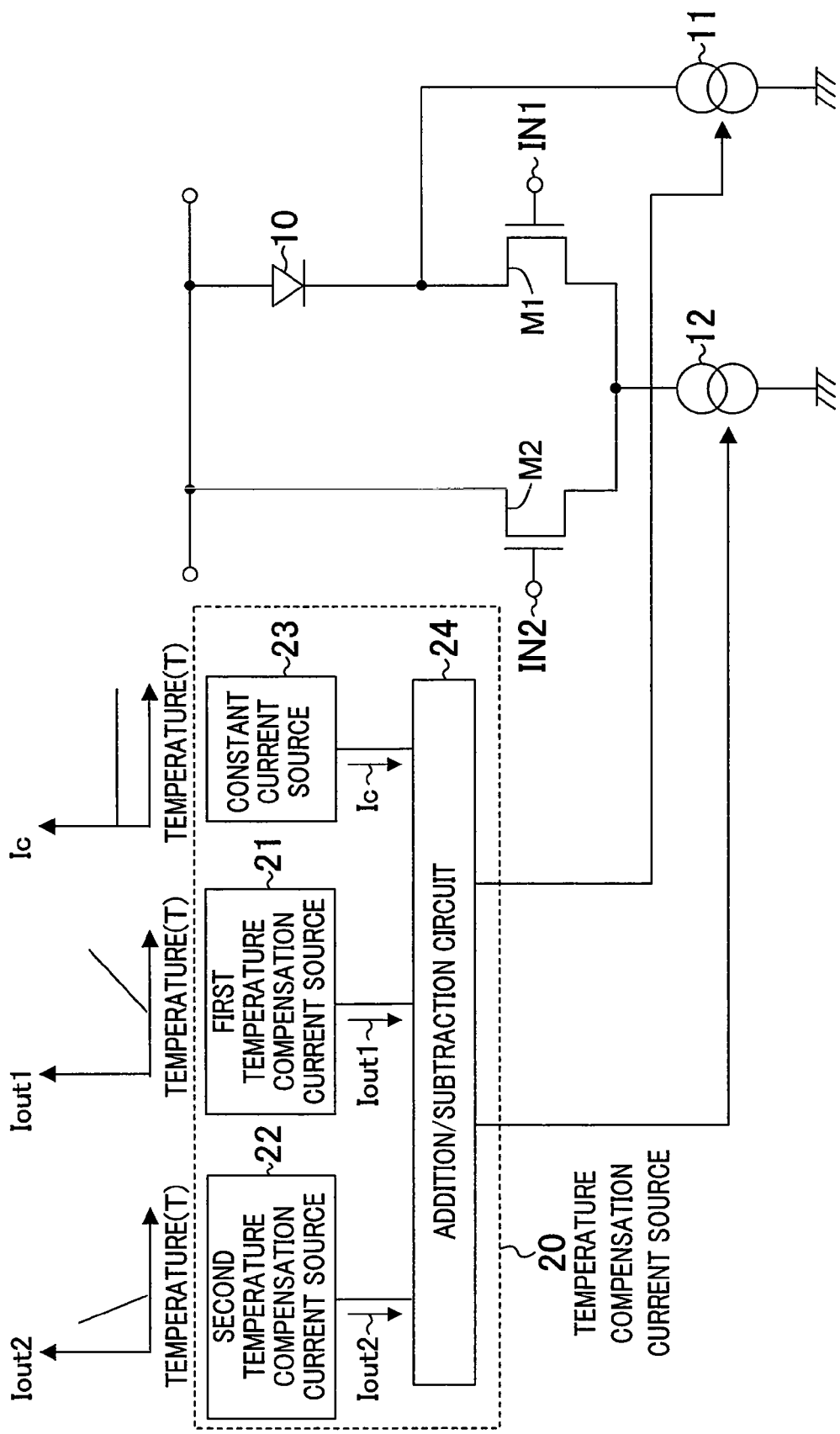

FIG.8
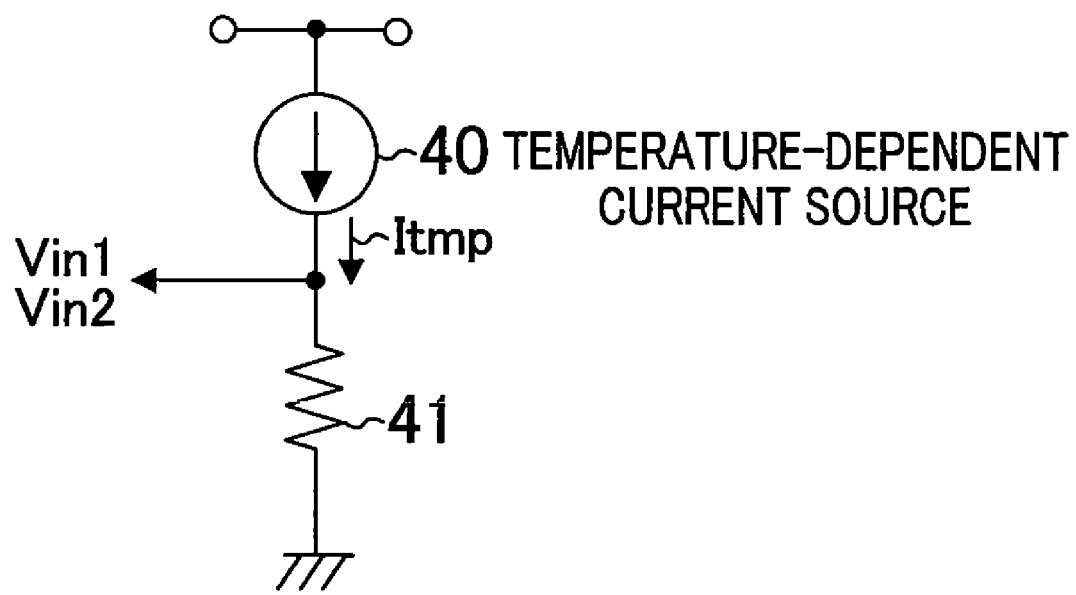
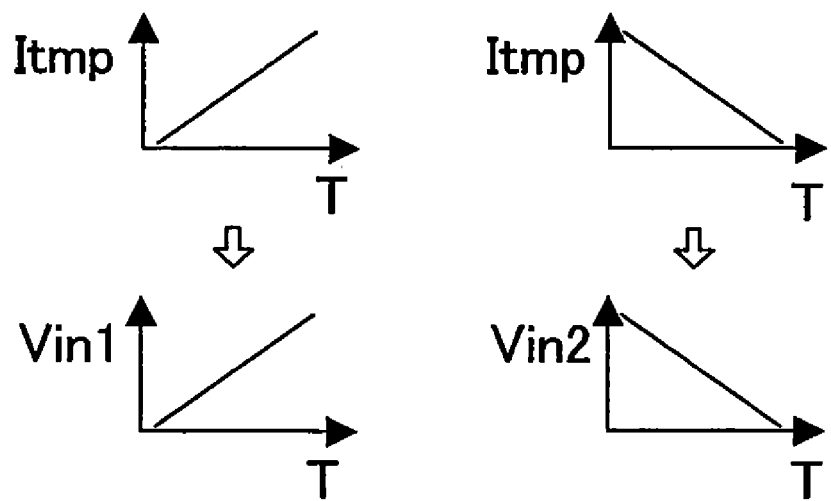

FIG.9
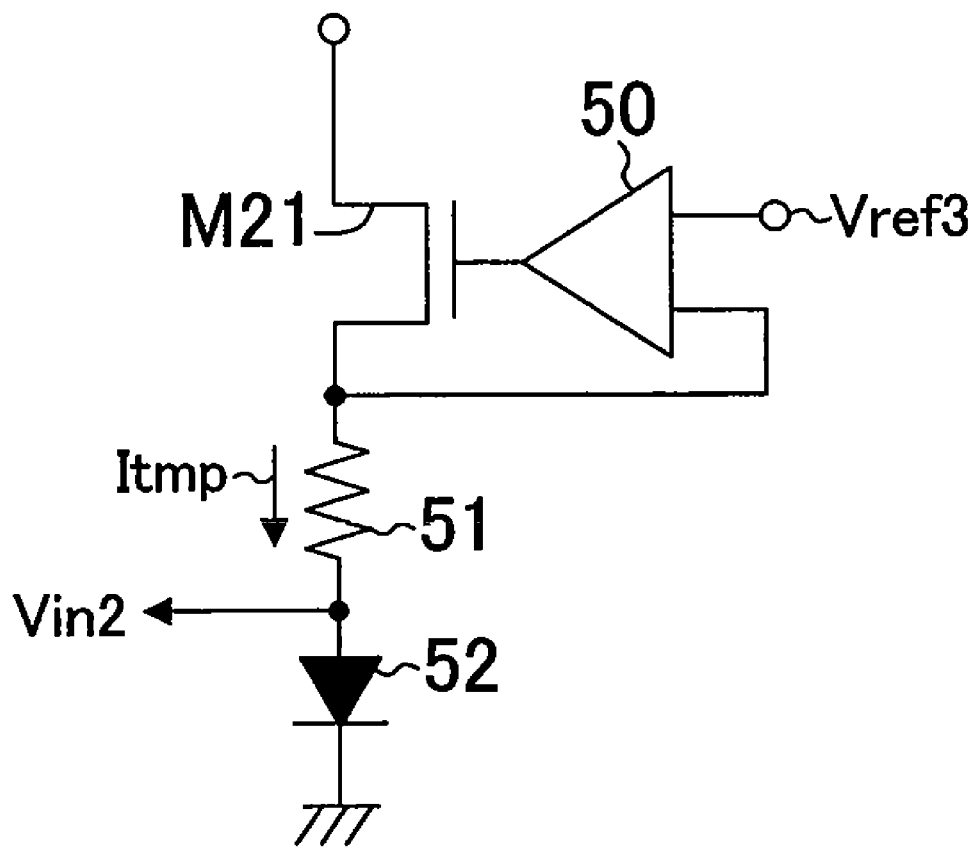
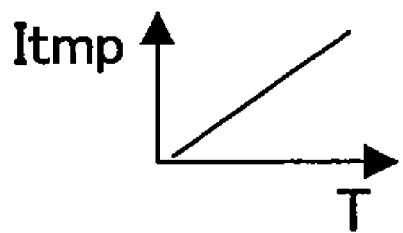
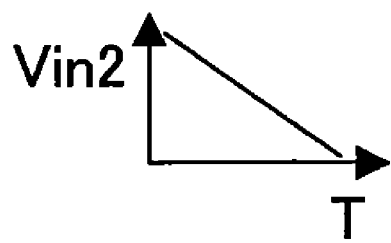

OPTICAL TRANSMISSION CIRCUIT

TECHNICAL FIELD

The present invention relates to an optical transmission circuit with an APC (Automatic Power Control) function.

BACKGROUND ART

In recent years, as the Internet is becoming more widespread, there is an increasing demand for high-speed and high-capacity data communication. In this situation, light transfer systems having excellent high-speed performance have attracted attention and have been vigorously developed. In an optical transmission circuit used in the light transfer system, a drive circuit including a light emitting device, such as a laser diode (LD) or a light emitting diode (LED), is generally employed. However, laser diodes and light emitting diodes have a high level of temperature dependency, i.e., the threshold current increases with an increase in temperature, disadvantageously resulting in a reduction in current-light conversion efficiency. Therefore, when a constant current is invariably output from the drive circuit, optical output power after conversion varies depending on temperature. In particular, the optical output power is disadvantageously low at high temperature. Further, since light is not emitted when a current is lower than or equal to the threshold current, if a bias current (L level of an output current) is lower than the threshold current of a laser diode, the duty factor is also deteriorated.

Therefore, conventionally, in order to invariably output a constant optical output power to obtain stable communication characteristics, the following two methods are used: temperature is measured using a thermistor or the like, and a feedforward control is performed so as to attain a previously set temperature-dependent current value; and the output of a laser diode is monitored using an MPD (monitoring photodiode), and a feedback control is performed so that a current flowing through the MPD is invariably constant. When cost reduction is aimed, the feedforward control method is generally employed in which the cost of the MPD can be eliminated, a feedback-system circuit can be removed, and the chip area can be largely decreased.

According to a conventional technique, a laser diode drive circuit with a temperature compensation circuit comprises a current drive circuit including a differential pair of transistors, a bias circuit for causing a DC bias current to flow through a laser diode, a bias current temperature compensation circuit for controlling a bias current flowing through the bias circuit, depending on ambient temperature, a drive current temperature compensation circuit for controlling a drive current of the laser diode, depending on ambient temperature, and a subtraction circuit, thereby providing a feedforward configuration in which the bias current and the drive current increase with an increase in temperature due to the temperature characteristics of a thermistor and a diode provided therein, so that optical output power can be invariably held constant during transmission (see Patent Document 1).
Patent Document 1: Japanese Unexamined Patent Application Publication No. H10-284791

DISCLOSURE OF THE INVENTION

Problems to be Solved by the Invention

However, in recent years, a Vertical Cavity Surface Emitting Laser (VCSEL) has been manufactured and light transfer has been carried out using the VCSEL instead of a laser diode or a light emitting diode. VCSELs are a light emitting device that has high reliability and high-speed drive performance, and for which large-scale array integration and mass production can be carried out, resulting in a reduction in cost. Note that VCSELs also have a high level of temperature dependency. Further, the temperature characteristics are different from those of laser diodes or light emitting diodes, and have a peculiar behavior such that the optical output power monotonously decreases with an increase in temperature below a threshold temperature, and monotonously increases with an increase in temperature above a threshold temperature.

Therefore, in the above-described conventional technique, the output current monotonously increases with an increase in temperature. Therefore, the temperature characteristics of light emitting devices, such as laser diodes, light emitting diodes or the like, can be compensated for. However, the peculiar temperature characteristics of VCSELs cannot be compensated for.

Further, taking it into consideration that light transfer is employed in consumer product applications, such as mobile telephones, AV apparatuses and the like, and in-car apparatus applications, such as in-car networks and the like, in the future, temperature compensation covering a temperature range of as wide as −40 to 85° C. is essential. In this case, it is considered that the whole peculiar temperature characteristics of VCSELs need to be compensated for.

An object of the present invention is to provide an optical transmission circuit that compensates for the peculiar temperature characteristics of a light emitting device, such as a VCSEL, and invariably keeps constant optical output power.

Solution to the Problems

To solve the above-described problems, an optical transmission circuit includes a light emitting device having different temperature characteristics at low temperature and high temperature, differential switch transistors for driving the light emitting device, the differential switch transistors having sources connected to each other and drains connected to the light emitting device and a power supply, respectively, a bias current source for causing a bias current to flow through the light emitting device, a modulated current source for causing a modulated current to flow through the light emitting device, and a temperature compensation current source for controlling currents of the bias current source and the modulated current source so as to compensate for both temperature characteristics at low temperature and temperature characteristics at high temperature of the light emitting device.

Effect of the Invention

According to the present invention, even when a light emitting device having different temperature characteristics at high temperature and low temperature (e.g., a VCSEL) is used, the temperature characteristics of the light emitting device can be compensated for over a whole temperature range. As a result, data transfer can be performed with invariably constant optical output power, so that a stable optical communication system can be constructed.

BRIEF DESCRIPTION OF THE DRAWINGS

FIG. 1 is a circuit diagram showing an exemplary configuration of an optical transmission circuit according to the present invention.

FIG. 3 is a circuit diagram showing another exemplary configuration of the optical transmission circuit of the present invention.

FIG. 8 is a circuit diagram showing an exemplary configuration of temperature-dependent voltage sources of FIGS. 4 to 7.

FIG. 9 is a circuit diagram showing another exemplary configuration of the temperature-dependent voltage sources of FIGS. 6 and 7.

Figure 2A:
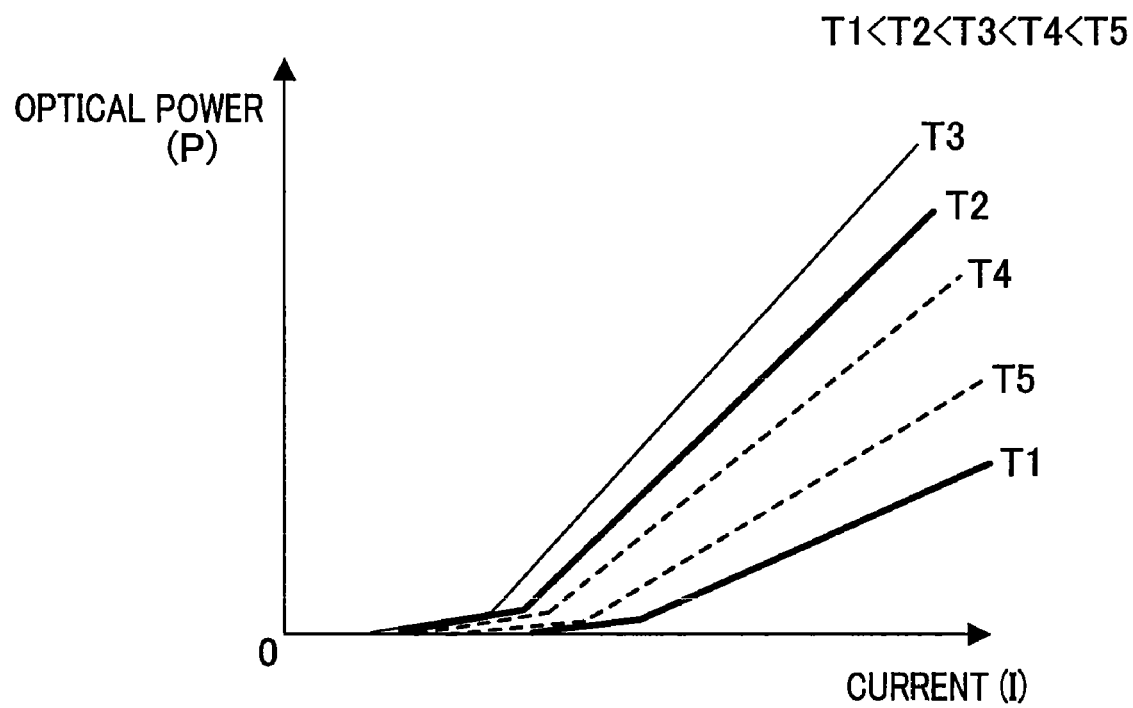
FIG. 2A is a diagram showing optical power-vs-current characteristics of a light emitting device of FIG. 1, where temperature is a parameter.

DESCRIPTION OF THE REFERENCE CHARACTERS 10 light emitting device (VCSEL)
11 bias current source
12 modulated current source
20 temperature compensation current source
21 first temperature compensation current source
22 second temperature compensation current source
23 constant current source
24 addition/subtraction circuit
30 temperature-dependent voltage source
31 constant current source
32, 33 resistance
34, 35 variable resistance
36, 37 comparator
40 temperature-dependent current source
41 resistance
50, 70 operational amplifier
51, 71 resistance
52, 72 diode
60 temperature-dependent current source
61 constant current source
62 comparator
81, 82, 83 constant current source
M1 to M62 transistor

BEST MODE FOR CARRYING OUT THE INVENTION

Hereinafter, embodiments of the present invention will be described in detail with reference to the accompanying drawings.

Figure 2B:
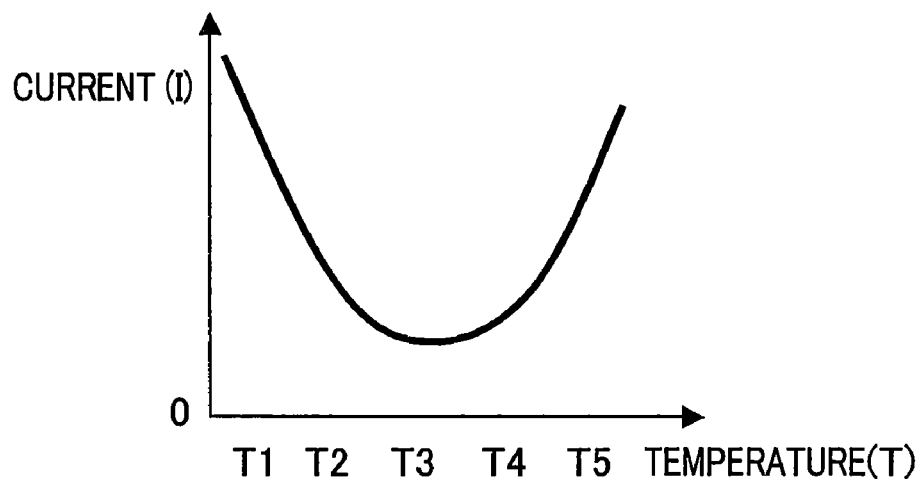
FIG. 2B is a diagram showing current-vs-temperature characteristics of the light emitting device of FIG. 1.

FIG. 1 shows an exemplary configuration of an optical transmission circuit according to the present invention. Also, FIGS. 2A and 2B show temperature characteristics of a light emitting device 10 of FIG. 1. T represents temperature, P represents optical power, and I represents a current.

The optical transmission circuit of FIG. 1 comprises the light emitting device (e.g., a VCSEL) 10 having different temperature characteristics at low temperature and high temperature, differential switch transistors M1 and M2 for driving the light emitting device 10, the sources thereof being coupled with each other, the drains thereof being connected to the light emitting device 10 and a power supply, respectively, and differential input signals IN1 and IN2 being input to the gates thereof, respectively, a bias current source 11 connected to the drain of the switch transistor M1 so as to cause a bias current to flow through the light emitting device 10, a modulated current source 12 connected to the sources of the differential switch transistors M1 and M2 so as to cause a modulated current to flow through the light emitting device 10, and a temperature compensation current source 20 for controlling currents of the bias current source 11 and the modulated current source 12 so as to compensate for both temperature characteristics at low temperature and temperature characteristics at high temperature of the light emitting device 10.

The temperature compensation current source 20 may be comprised of a single circuit or a combination of two or more circuits or may have any other configuration as long as both the temperature characteristics at high temperature and the temperature characteristics at low temperature of the light emitting device 10 can be compensated for. Particularly, it is here assumed that a first temperature compensation current source 21 for compensating for the high-temperature characteristics of the light emitting device 10 and a second temperature compensation current source 22 for compensating for the low-temperature characteristics of the light emitting device 10 are provided, and these two current sources 21 and 22 are combined.

In this optical transmission circuit, when the input signal IN1 is at the L level and the input signal IN2 is at the H level, the switch transistor M1 is turned OFF and the switch transistor M2 is turned ON, so that only a bias current set by the bias current source 11 is output to the light emitting device 10. Next, when the input signal IN1 is at the H level and the input signal IN2 is at the L level, the switch transistor M1 is turned ON and the switch transistor M2 is turned OFF, so that a bias current set by the bias current source 11 and a modulated current set by the modulated current source 12 are added and the result is output to the light emitting device 10. Thus, by turning ON/OFF of the differential switch transistors M1 and M2, a current depending on the input signals IN1 and IN2 is output to the light emitting device 10. The light emitting device 10 performs current-light conversion, depending on an input current to output light.

In order to invariably output a constant optical power for the purpose of stable communication, the bias current and the modulated current need to be changed, depending on temperature. However, as shown in FIG. 2A, in the temperature characteristics of a VCSEL, the threshold increases and the conversion efficiency (current-light conversion efficiency) decreases with an increase in temperature, and also when temperature is low, the threshold increases and the conversion efficiency (current-light conversion efficiency) decreases. Thus, the temperature characteristics of a VCSEL are peculiar. Therefore, in order to employ a VCSEL and invariably output a constant optical power, a threshold temperature that serves as a reference needs to be detected, and a current needs to be increased both when temperature is higher than the threshold temperature and when temperature is lower than the threshold temperature.

Therefore, in the present invention, as shown in FIG. 1, temperature compensation is performed separately for the high-temperature characteristics and low-temperature characteristics having different behaviors, so that peculiar temperature characteristics, such as those of a VCSEL, can be compensated for.

Specifically, in order to compensate for the high-temperature characteristics of the light emitting device 10, the first temperature compensation current source 21 is provided in which only a constant current is caused to flow when temperature is lower than or equal to a first threshold, and a current that increases with an increase in temperature is caused to flow when temperature is higher than the first threshold. Also, in order to compensate for the low-temperature characteristics of the light emitting device 10, the second temperature compensation current source 22 is provided in which only a constant current is caused to flow when temperature is higher than a second threshold, and a current that increases with a decrease in temperature is caused to flow when temperature is lower than the second threshold. An addition of an output current Iout1 of the first temperature compensation current source 21 and an output current Iout2 of the second temperature compensation current source 22 is used.

With this circuit, it is possible to obtain a current output which has a combination of both temperature characteristics in a high-temperature region and temperature characteristics in a low-temperature region that are totally different from each other, so that the bias current source 11 and the modulated current source 12 can be controlled using this current. As a result, it is possible to compensate for the temperature characteristics of the light emitting device 10 (e.g., a VCSEL) in which temperature-current characteristics have different slopes in the high-temperature region and the low-temperature region. Particularly, in some VCSELs, the temperature-current characteristics have totally different slopes in the high-temperature region and the low-temperature region. Also in such a case, separate controls can be performed as described above, so that a control suited to each characteristics with higher precision can be performed.

Here, the threshold temperature is designed to be a temperature at which the light emitting device 10 is most frequently used, and may be typically set to be in the vicinity of room temperature. In the present invention, the threshold temperature may be detected inside the circuit using a diode or a temperature sensor provided therein, or may be detected outside the circuit using a thermistor or the like, depending on the characteristics of each light emitting device 10. When cost reduction is aimed, a built-in detector is more preferable.

Although it has been assumed above that the two temperature compensation current sources 21 and 22 are used, one or three or more current sources may be used, depending on the characteristics of the light emitting device 10. A higher-precise current may be generated by addition/subtraction with another current source. As long as compensation can be performed for the light emitting device 10, the characteristics and the addition/subtraction method of the first and second temperature compensation current sources 21 and 22 are not limited.

Although a VCSEL has been described as an example of the light emitting device 10, the present invention is applicable to any light emitting devices that have different characteristics at high temperature and low temperature.

FIG. 3 shows another exemplary configuration of the optical transmission circuit of the present invention. The optical transmission circuit of FIG. 3 has the same basic configuration as that of FIG. 1 and differs only in the configuration of the temperature compensation current source 20. Therefore, only the temperature compensation current source 20 will be described.

The temperature compensation current source 20 of FIG. 3 comprises a first temperature compensation current source 21 for outputting a current Iout1 so as to compensate for high-temperature characteristics of a light emitting device 10, a second temperature compensation current source 22 for outputting a current Iout2 so as to compensate for low-temperature characteristics of the light emitting device 10, a constant current source 23 for causing a constant reference current Ic to invariably flow, and an addition/subtraction circuit 24 for performing addition/subtraction of these three currents Iout1, Iout2 and Ic.

In the present invention, in order to compensate for the high-temperature characteristics of the light emitting device 10, the first temperature compensation current source 21 is provided in which a current is caused not to flow when temperature is lower than or equal to a first threshold, and a current that increases with an increase in temperature is caused to flow when temperature is higher than the first threshold. Also, in order to compensate for the low-temperature characteristics of the light emitting device 10, the second temperature compensation current source 22 is provided in which a current is caused not to flow when temperature is higher than or equal to a second threshold, and a current that increases with a decrease in temperature is caused to flow when temperature is lower than the second threshold. Further, the constant current source 23 that invariably supplies a constant current is provided. By adding outputs of these two temperature compensation current sources 21 and 22 and an output of the constant current source 23, it is possible to provide a current output that has both temperature characteristics in a high-temperature region and temperature characteristics in a low-temperature region that are totally different from each other. Particularly, in some VCSELs, the temperature-current characteristics have totally different slopes in a high-temperature region and a low-temperature region. Therefore, by performing separate controls as described above, each characteristics can be performed with higher precision.

More specifically, at high temperature, the current Iout1 from the first temperature compensation current source 21 and the current Ic from the constant current source 23 are added so as to increase a current flowing through the light emitting device 10 with an increase in temperature. On the other hand, at low temperature, the current Iout2 from the second temperature compensation current source 22 and the current Ic from the constant current source 23 are added to increase a current flowing through the light emitting device 10 with a decrease in temperature. At a threshold temperature, only the stable current Ic is output from the constant current source 23.

Here, as long as compensation can be performed for the light emitting device 10, the characteristics and the addition/subtraction method of the first and second temperature compensation current sources 21 and 22 are not limited. The addition/subtraction circuit 24 may have a function of performing an analog operation, a logical operation, or only addition, and has any configuration that can perform a calculation for obtaining a desired result.

Although it has been assumed above that the two temperature compensation current sources 21 and 22 are used, one or three or more temperature compensation current sources may be used, depending on the characteristics of the light emitting device 10. Although it has also been assumed that the single constant current source 23 is used, two or more constant current sources may be used so as to improve the precision of temperature-dependent characteristics.

A threshold temperature may be detected inside the circuit using a diode or a temperature sensor provided therein, or may be detected outside the circuit using a thermistor or the like. When cost reduction is aimed, a built-in detector is preferable.

As described above, with the configuration of FIG. 3, a stationary current value that invariably flows can be additionally set, so that an output current in the vicinity of the threshold temperature can be easily set, resulting in stable characteristics. In addition, as in the case of FIG. 1, temperature dependency can be set at low temperature and at high temperature separately, so that high-precision temperature compensation can be performed.

Figure 4:
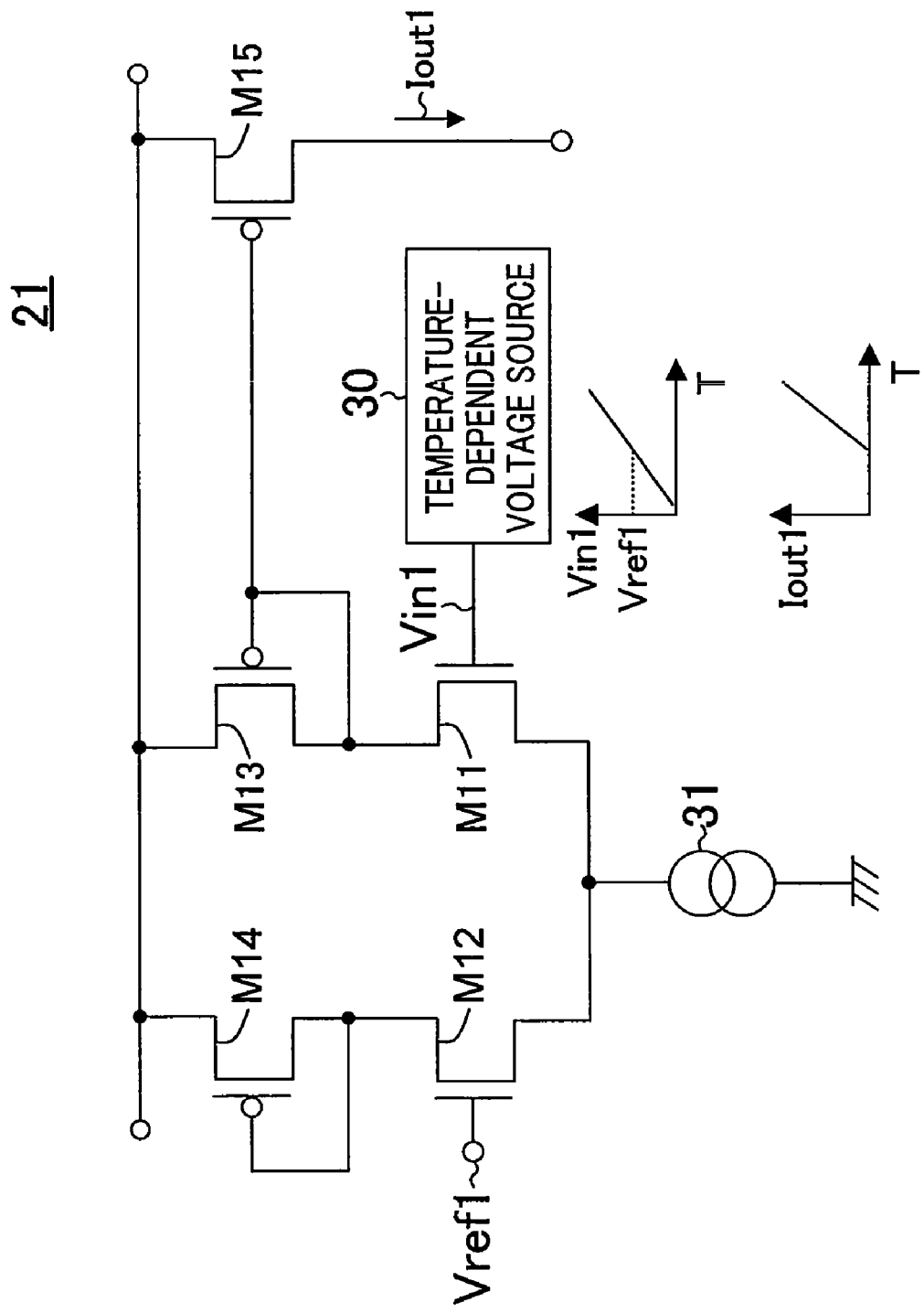
FIG. 4 is a circuit diagram showing an exemplary configuration of first temperature compensation current sources of FIGS. 1 and 3.

FIG. 4 shows an exemplary configuration of the first temperature compensation current sources 21 of FIGS. 1 and 3. The circuit of FIG. 4 comprises a constant current source 31, differential switch transistors M11 and M12 whose sources are connected to the constant current source 31, current source transistors M13 and M14 whose drains and gates are connected to the drains of the differential switch transistors M11 and M12, respectively, and whose sources are connected to a power supply, and a current output transistor M15 whose gate is connected to the gate of the current source transistor M13 and whose source is connected to the power supply.

Here, a previously set reference voltage Vref1 (corresponding to a threshold temperature) is input to the gate of the switch transistor M12, and a temperature-dependent voltage (e.g., a voltage having positive temperature characteristics that increase with an increase in temperature) Vin1 that is output from a temperature-dependent voltage source 30 is input to the gate of the switch transistor M11. Here, when the temperature-dependent voltage Vin1 is lower than or equal to the reference voltage Vref1, a current does not flow through the current source transistor M13, so that a current is not output from the drain of the current output transistor M15. On the other hand, when the temperature-dependent voltage Vin1 is higher than the reference voltage Vref1, a current depending on the voltage Vin1 flows through the current source transistor M13, so that a mirror current is output from the drain of the current output transistor M15. Also, here, the change amount of a current can be easily set by changing the mirror ratio of a current mirror. With the above-described configuration, the temperature-dependent current Iout1 can be caused to flow only when the temperature-dependent voltage Vin1 is higher than or equal to the previously set reference voltage Vref1 (corresponding to the threshold temperature).

Figure 5:
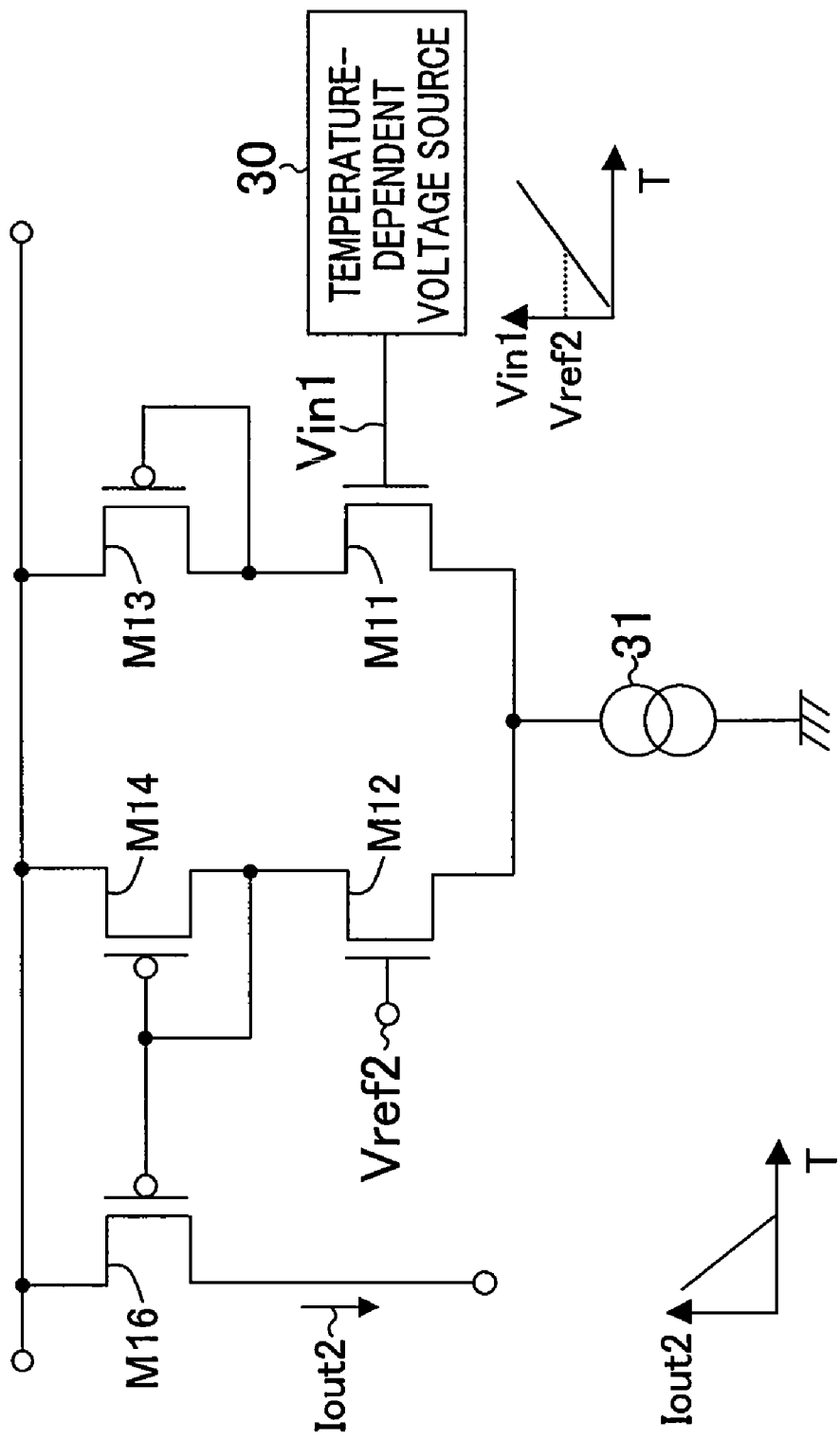
FIG. 5 is a circuit diagram showing an exemplary configuration of second temperature compensation current sources of FIGS. 1 and 3.

FIG. 5 shows an exemplary configuration of the second temperature compensation current sources 22 of FIGS. 1 and 3. The circuit of FIG. 5 comprises a constant current source 31, differential switch transistors M11 and M12 whose sources are connected to the constant current source 31, current source transistors M13 and M14 whose drains and gates are connected to the drains of the differential switch transistors M11 and M12, respectively, and whose sources are connected to a power supply, and a current output transistor M16 whose gate is connected to the gate of the current source transistor M14 and whose source is connected to the power supply.

Here, a previously set reference voltage Vref2 (corresponding to a threshold temperature) is input to the gate of the switch transistor M12, and a temperature-dependent voltage (e.g., a voltage having positive temperature characteristics that increase with an increase in temperature) Vin1 that is output from a temperature-dependent voltage source 30 is input to the gate of the switch transistor M11. Here, when the temperature-dependent voltage Vin1 is higher than or equal to the reference voltage Vref2, a current does not flow through the current source transistor M14, so that a current is not output from the drain of the current output transistor M16. On the other hand, when the temperature-dependent voltage Vin1 is lower than or equal to the reference voltage Vref2, a current depending on the voltage Vin1 flows through the current source transistor M14, so that a mirror current is output from the drain of the current output transistor M16. Also, here, the change amount of a current can be easily set by changing the mirror ratio of a current mirror. With the above-described configuration, the temperature-dependent current Iout2 can be caused to flow only when the temperature-dependent voltage Vin1 is lower than or equal to the previously set reference voltage Vref2 (corresponding to the threshold temperature).

Figure 6:
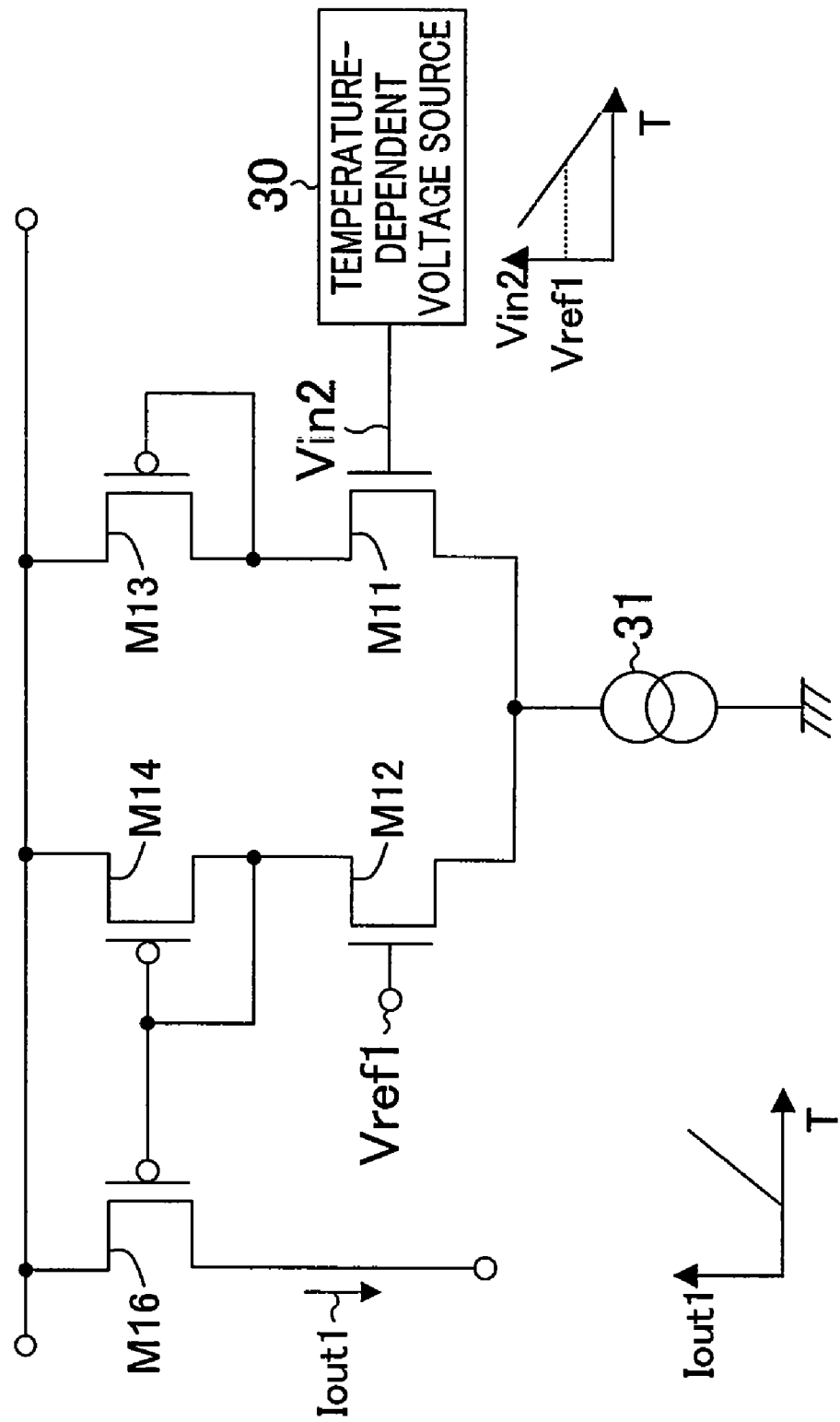
FIG. 6 is a circuit diagram showing a variation of the configuration of FIG. 4.

FIG. 6 shows a variation of the configuration of FIG. 4. In a first temperature compensation current source 21 of FIG. 6, it is assumed that a voltage Vin2 having negative temperature characteristics that decreases with an increase in temperature is output by a temperature-dependent voltage source 30.

Figure 7:
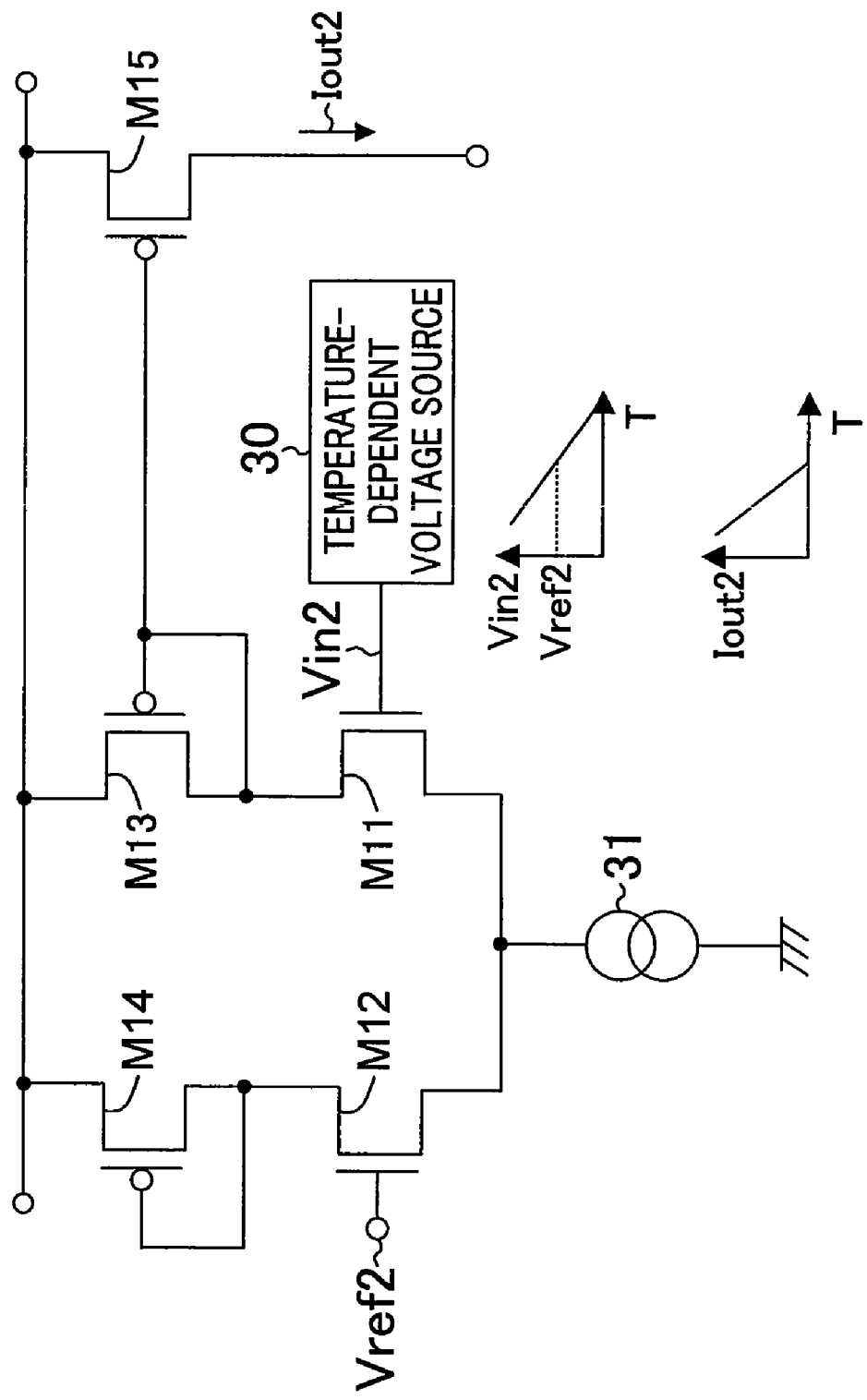
FIG. 7 is a circuit diagram showing a variation of the configuration of FIG. 5.

FIG. 7 shows a variation of the configuration of FIG. 5. In a second temperature compensation current source 22 of FIG. 7, it is also assumed, as in the case of FIG. 6, that a voltage Vin2 having negative temperature characteristics that decreases with an increase in temperature is output by a temperature-dependent voltage source 30.

Although it has been assumed in FIGS. 4 to 7 that the differential switch transistors M11 and M12 have an N-channel configuration, the differential switch transistors M11 and M12 may have a P-channel configuration and the other circuits may have a reversed circuit configuration.

Further, the circuit configurations of FIGS. 4 to 7 may each be used as a basic configuration, and a plurality of current sources may be added and a temperature-dependent current and a constant current may be subjected to addition/subtraction so as to change an absolute value, temperature dependency or the like, thereby performing high-precision temperature compensation. Also, the current source circuit section may have a cascode configuration.

FIG. 8 shows an exemplary configuration of the temperature-dependent voltage sources 30 of FIGS. 4 to 7. This circuit has a configuration in which a temperature-dependent current source 40 that outputs a temperature-dependent current Itmp and a resistance 41 are connected in series. With such a simple configuration, a temperature-dependent voltage in proportion to the current Itmp is output as a voltage Vin1 or Vin2 from a connection portion of the temperature-dependent current source 40 and the resistance 41. Although it has been assumed in FIG. 8 that the temperature-dependent current source 40 is connected to a power supply, the temperature-dependent current source 40 may be reversed and grounded.

FIG. 9 shows another exemplary configuration of the temperature-dependent voltage sources 30 of FIGS. 6 and 7. This circuit comprises a current source transistor M21, an operational amplifier 50 whose inputs receive a reference voltage Vref3 that is generated by a stable voltage source, such as a band gap reference circuit or the like, and a source voltage of the current source transistor M21, and whose output is connected to the gate of the current source transistor M21, a resistance 51 whose one end is connected to the source of the current source transistor M21, and a diode 52 connected between the other end of the resistance 51 and the ground. Here, at high temperature, since the diode 52 has a property such that a voltage across the diode 52 is small, a voltage drop of the diode 52 is small. Therefore, a voltage Vin2 output from a connection end of the diode 52 and the resistance 51 depends on temperature, so that the output voltage decreases with an increase in temperature. This configuration is different from that of FIG. 8 in that the temperature-dependent current source 40 is not required, and the temperature characteristics of the diode 52 can be used to generate the temperature-dependent voltage Vin2.

Note that the configuration of FIG. 9 can be employed as the temperature-dependent current source 40 of FIG. 8. Specifically, the source voltage of the current source transistor M21 is invariably equal to the reference voltage Vref3 at the input of the operational amplifier 50, and at high temperature, the voltage drop of the diode 52 is small due to the property of the diode 52 that the voltage across the diode 52 is small, so that a voltage applied to the resistance 51 is high. As a result, the current Itmp flowing through the resistance 51 depends on temperature, and increases with an increase in temperature. Thus, the current Itmp supplied from the current source transistor M21 to the resistance 51 in FIG. 9 is used in FIG. 8.

Figure 10:
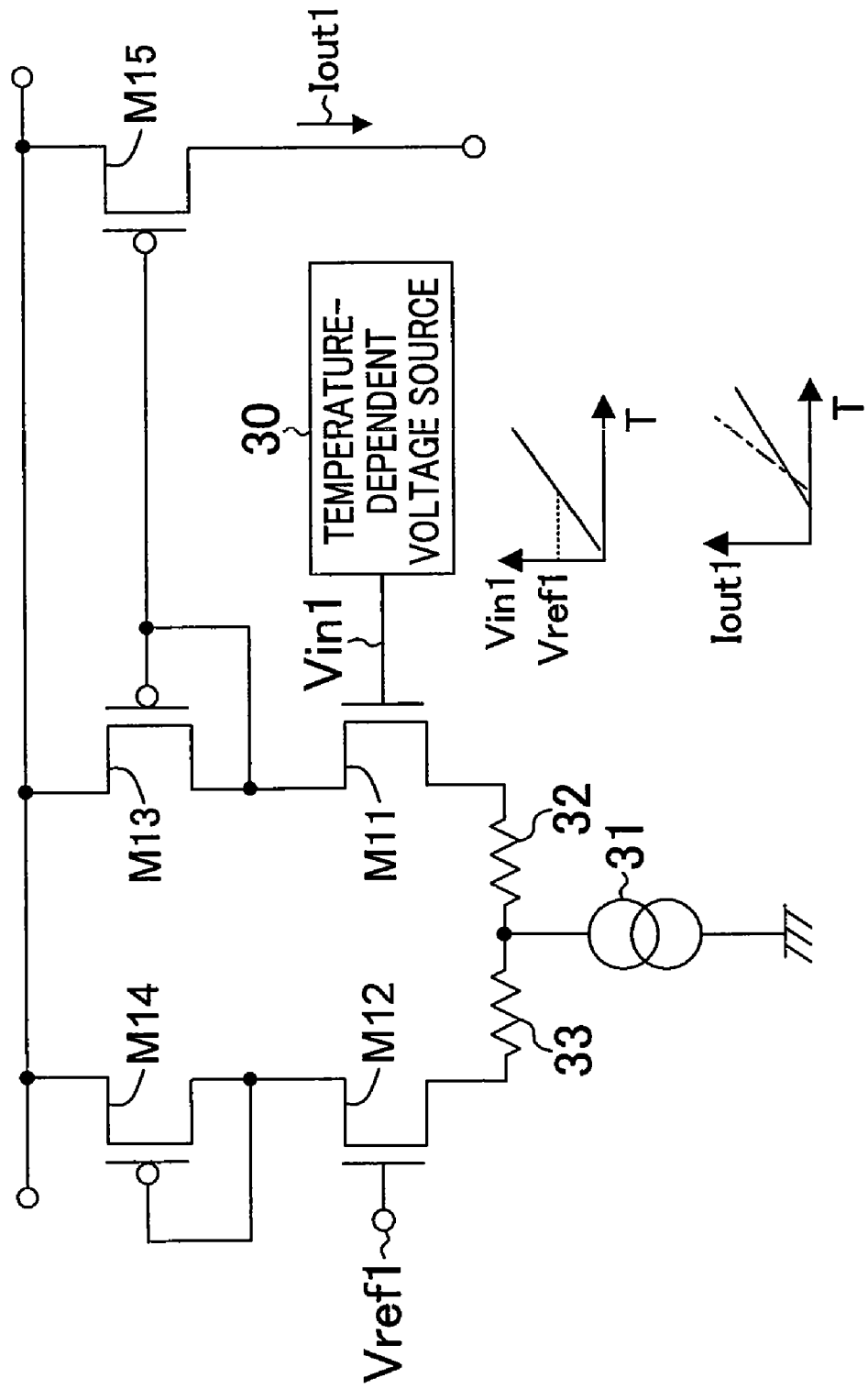
FIG. 10 is a circuit diagram showing another variation of the configuration of FIG. 4.

FIG. 10 shows another variation of the configuration of FIG. 4. This circuit has the same basic configuration as that of FIG. 4, and additionally includes resistances 32 and 33 between the sources of the differential switch transistors M11 and M12 and the constant current source 31, respectively. FIGS. 5 to 7 can be similarly modified. With this configuration, the characteristic curves of temperature dependency (temperature-current coefficient) of the first and second temperature compensation current sources 21 and 22 can be caused to have gentle slopes. Therefore, an adjustment for achieving desired temperature characteristics can be performed by an easy method of inserting the resistances 32 and 33.

Figure 11:
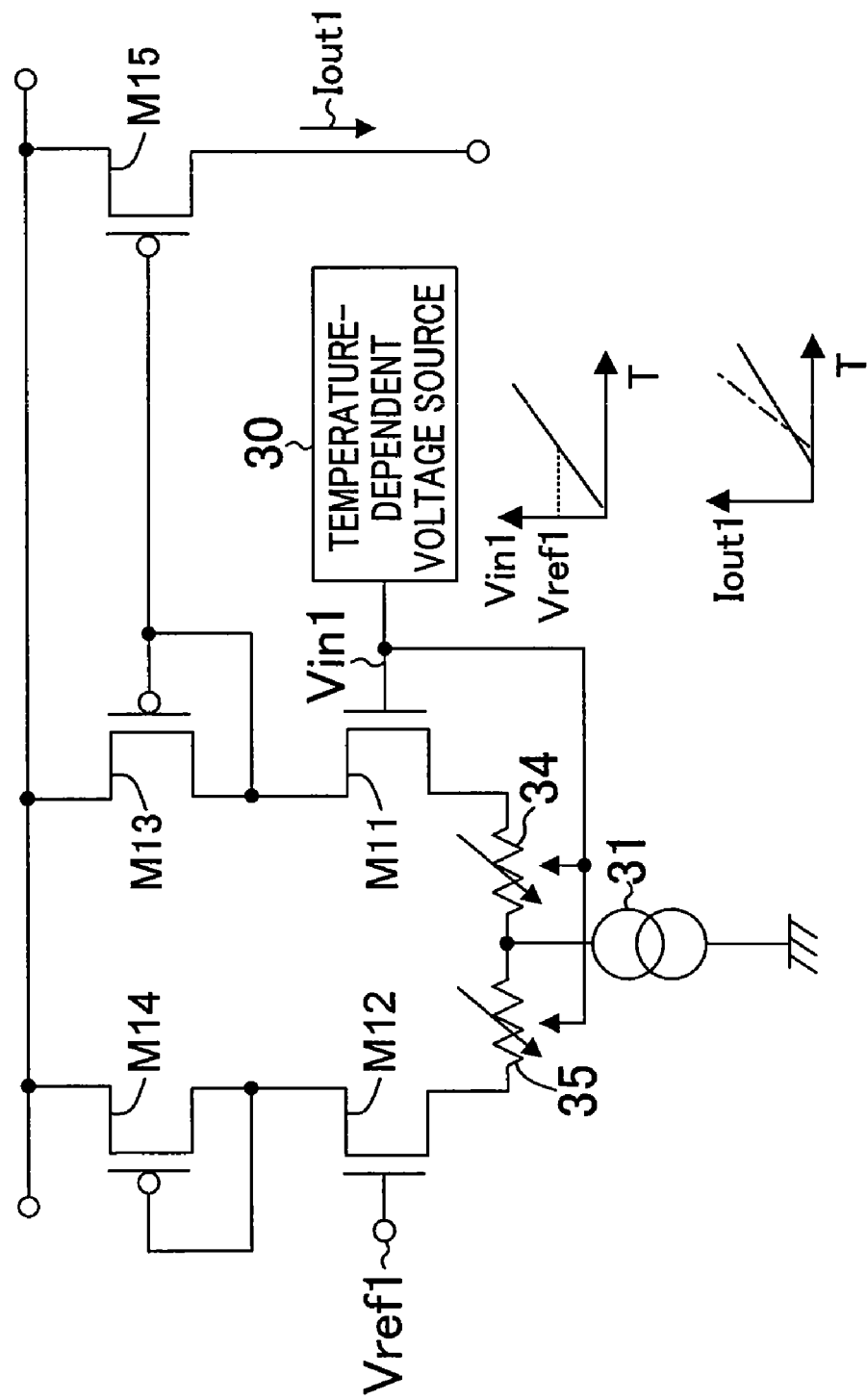
FIG. 11 is a circuit diagram showing still another variation of the configuration of FIG. 4.

FIG. 11 shows another variation of the configuration of FIG. 4. This circuit has the same basic structure as that of FIG. 10, and instead of the resistances 32 and 33 having a stationary value, employs variable resistances 34 and 35 to control a resistance value, depending on temperature, so as to change a characteristic curve of temperature dependency (temperature-current coefficient). Here, the variable resistances 34 and 35 may be controlled by a temperature-dependent voltage Vin1, or may be controlled in accordance with another signal that is output, depending on temperature, or may be controlled using a signal that is output, depending on temperature, a predetermined reference value, and a comparator only when a value within a predetermined range is detected. The control may be performed in a single stage or in two or more stages, depending on characteristics. With this configuration, more precise characteristics can be obtained, corresponding to the temperature of the light emitting device 10.

Figure 12:
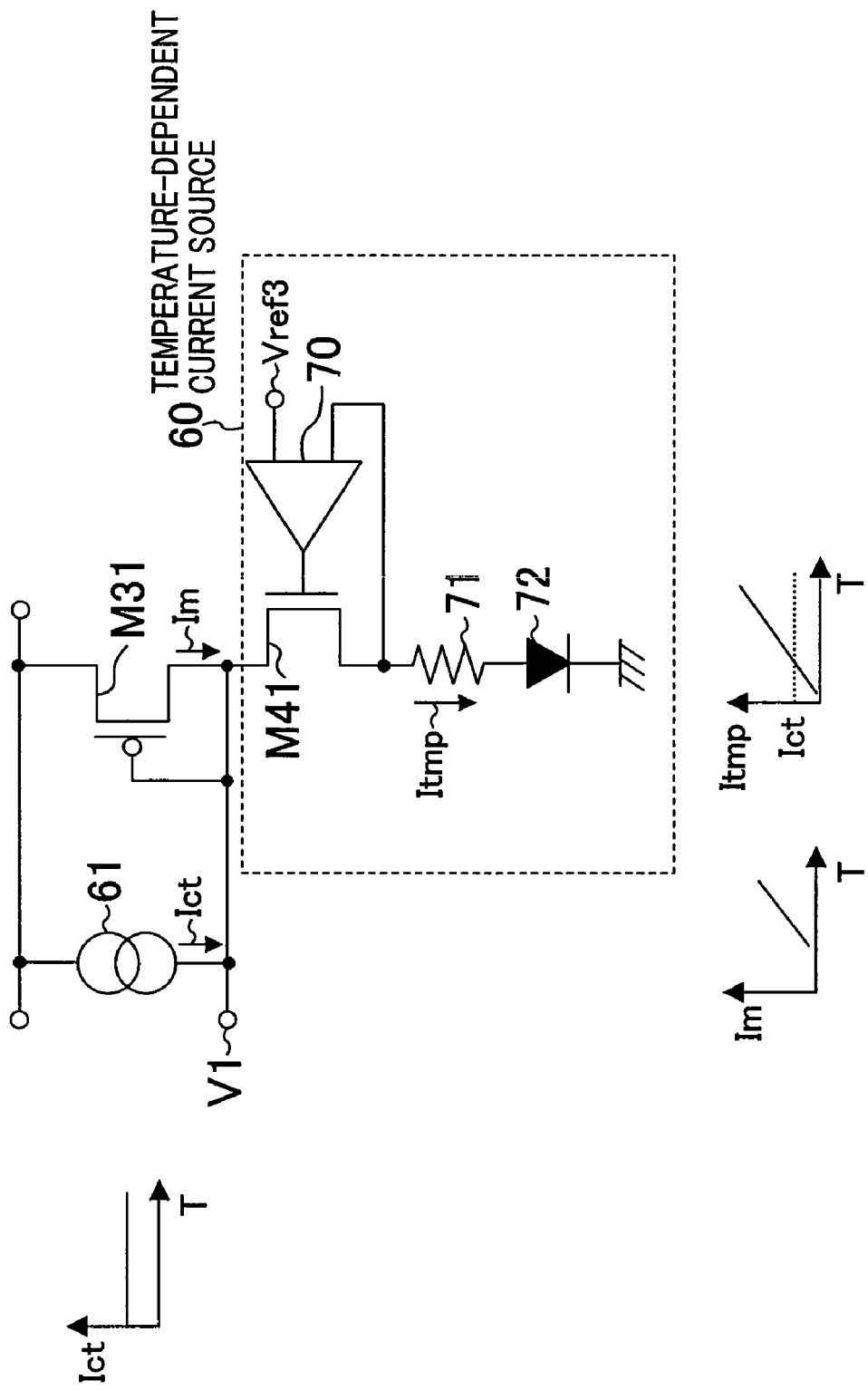
FIG. 12 is a circuit diagram showing another exemplary configuration of the first temperature compensation current sources of FIGS. 1 and 3.

FIG. 12 shows another exemplary configuration of the first temperature compensation current sources 21 of FIGS. 1 and 3. This configuration has a temperature-dependent current source 60 for outputting a temperature-dependent current, a current mirror transistor M31 whose drain and gate are connected to the temperature-dependent current source 60 and whose source is connected to a power supply, and a constant current source 61 connected between the drain of the current mirror transistor M31 and the power supply. The temperature-dependent current source 60 is comprised of a current source transistor M41, an operational amplifier 70, a resistance 71, and a diode 72, as in the temperature-dependent voltage source 30 of FIG. 9. A current Itmp flowing through the resistance 71 depends on temperature and increases with an increase in temperature. In other words, the current Itmp has positive temperature characteristics.

In this configuration, when temperature is low and a current Itmp flowing through the temperature-dependent current source 60 is smaller than a current Ict flowing through the constant current source 61, a current does not flow through the current mirror transistor M31. On the other hand, when temperature is high and the current Itmp flowing through the temperature-dependent current source 60 is larger than the current Ict flowing through the constant current source 61, a current Im flows through the current mirror transistor M31, so that a temperature-dependent voltage V1 is output from the drain of the current mirror transistor M31. Note that, based on the voltage V1, a current output transistor whose gate is connected to the gate of the current mirror transistor M31 and whose source is connected to the power supply, may output a current from its drain.

This configuration is comprised of a small number of components, and can output a temperature-dependent current with reference to a current flowing through the constant current source 61. In particular, a desired current value can be easily set since it can be achieved by subtraction of a current itself.

Figure 13:
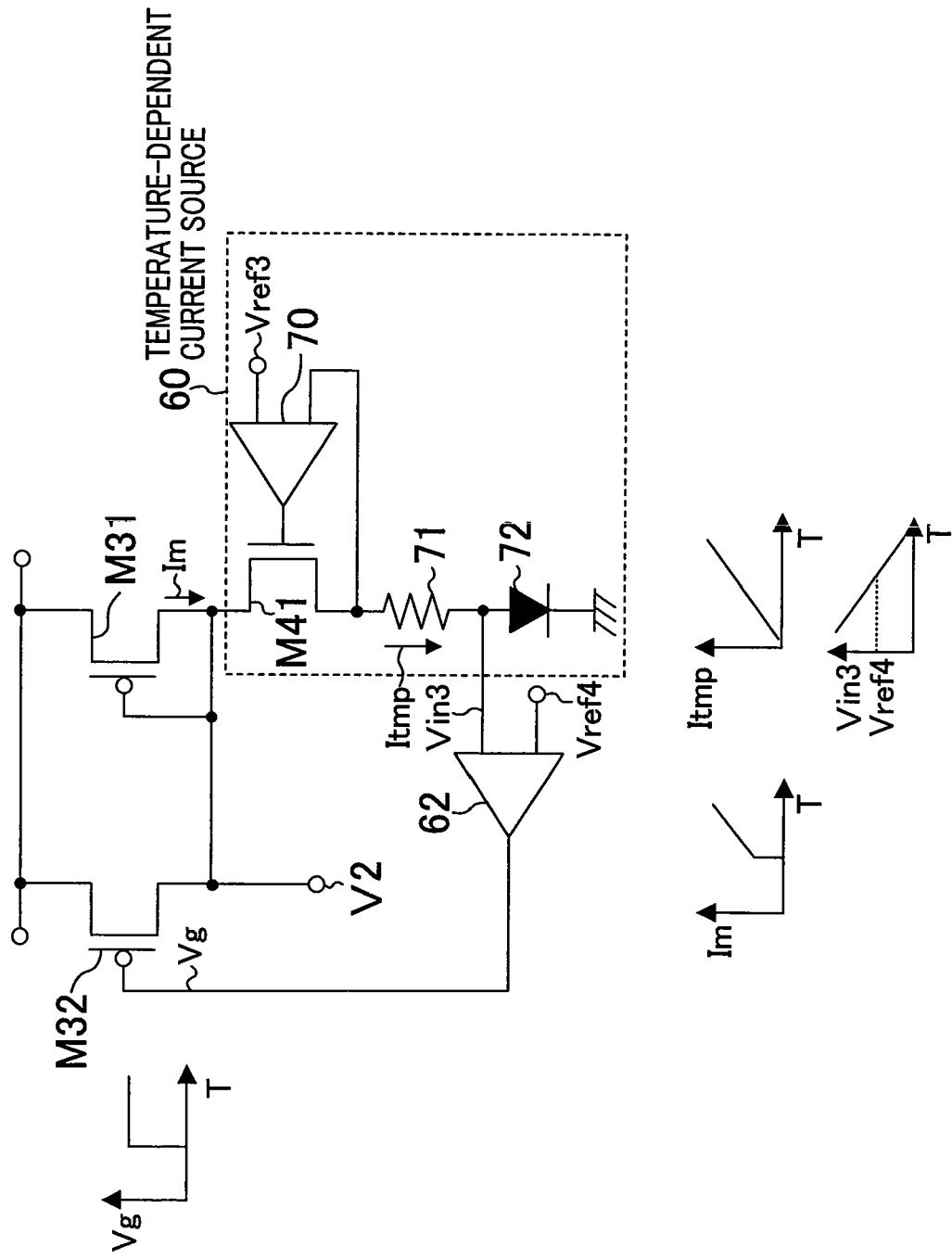
FIG. 13 is a circuit diagram showing a variation of the configuration of FIG. 12.

FIG. 13 shows a variation of the configuration of FIG. 12. This configuration has a temperature-dependent current source 60 for outputting a temperature-dependent current, a current mirror transistor M31 whose drain and gate are connected to the temperature-dependent current source 60 and whose source is connected to a power supply, a killer transistor M32 whose drain is connected to the drain of the current mirror transistor M31 and whose source is connected to the power supply, and a comparator 62 whose inputs receive a previously set reference voltage Vref4 and a temperature-dependent voltage Vin3 and whose output is connected to the gate of the killer transistor M32.

In this configuration, the comparator 62 compares a voltage Vin3 with the reference voltage Vref4. When the voltage Vin3 is larger than the reference voltage Vref4, a gate voltage Vg of the killer transistor M32 is controlled to turn ON the killer transistor M32 so that the gate of the current mirror transistor M31 and the power supply are short-circuited to interrupt the passage of a current. On the other hand, when the voltage Vin3 is smaller than the reference voltage Vref4, the killer transistor M32 is turned OFF so that a temperature-dependent voltage V2 is output from the drain of the current mirror transistor M31. Note that, based on the voltage V2, a current output transistor whose gate is connected the gate of the current mirror transistor M31 and whose source is connected to the power supply, may output a current from its drain.

This configuration is comprised of a small number of components, and can output a temperature-dependent current based on the reference voltage Vref4, as in FIG. 12.

Figure 14:
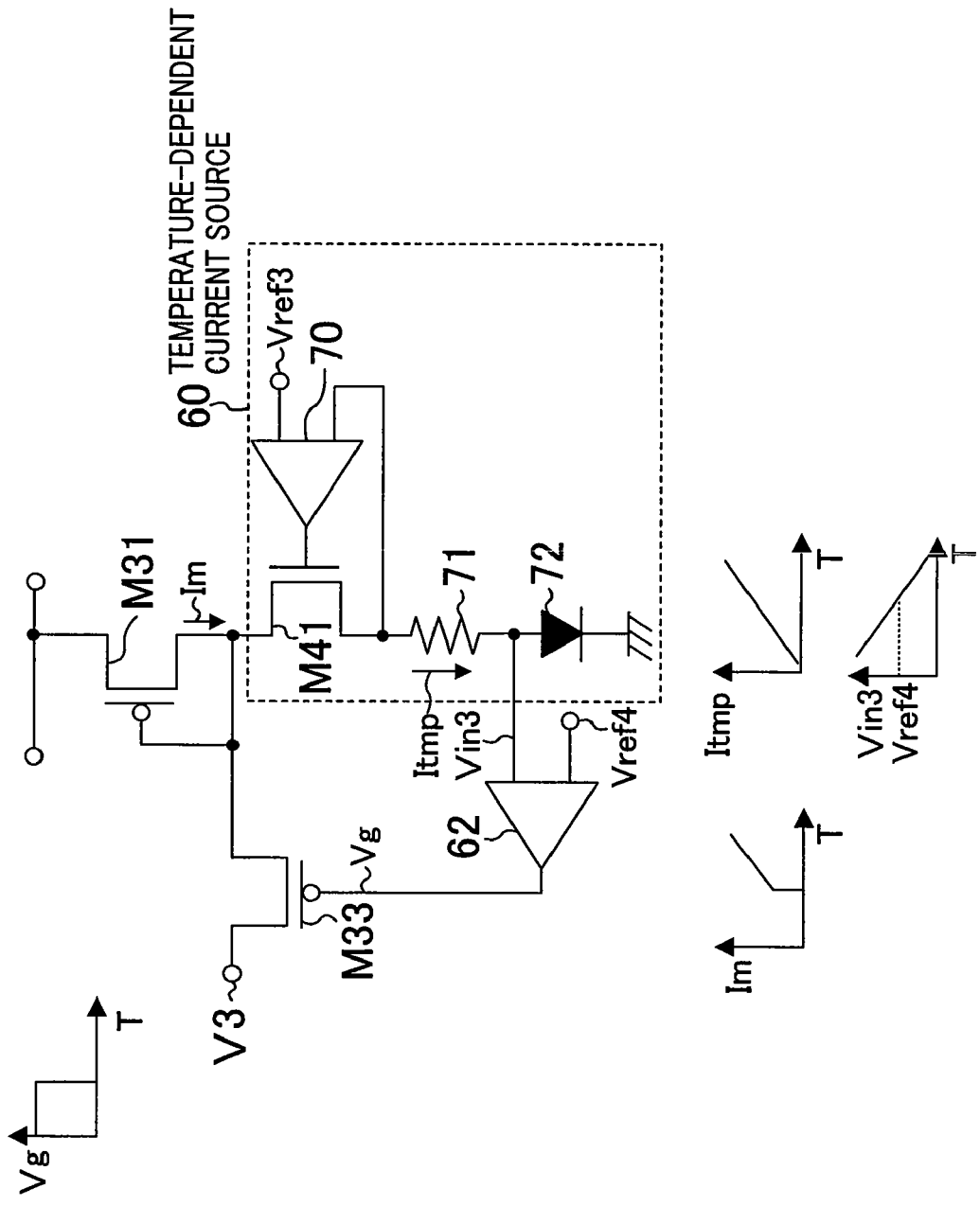
FIG. 14 is a circuit diagram showing another variation of the configuration of FIG. 12.

FIG. 14 shows another variation of the configuration of FIG. 12. This configuration has a temperature-dependent current source 60 for outputting a temperature-dependent current, a current mirror transistor M31 whose drain and gate are connected to the temperature-dependent current source 60 and whose source is connected to a power supply, a switch transistor M33 whose drain is connected to the current mirror transistor M31, and a comparator 62 whose inputs receive a previously set reference voltage Vref4 and a temperature-dependent voltage Vin3 and whose output is connected to the gate of the switch transistor M33.

In this configuration, the comparator 62 compares the voltage Vin3 with the reference voltage Vref4. When the voltage Vin3 is larger than the reference voltage Vref4, a gate voltage Vg of the switch transistor M33 is controlled to turn OFF the switch transistor M33 so that the gate of the current mirror transistor M31 is opened, thereby interrupting a current flowing through the current mirror transistor M31. On the other hand, when the voltage Vin3 is smaller than the reference voltage Vref4, the switch transistor M33 is turned ON so that the gate of the current mirror transistor M31 is connected to an output of a temperature-dependent voltage V3. Note that, based on the voltage V3, a current output transistor whose gate is connected the source of the switch transistor M33 and whose source is connected to the power supply, may output a current from its drain.

This configuration is comprised of a small number of components, and can output a temperature-dependent current based on the reference voltage Vref4, as in FIG. 12.

Here, in the configurations of FIGS. 13 and 14, it has been assumed that the temperature-dependent current source 60 has positive temperature characteristics, and when the voltage Vin3 is larger than the reference voltage Vref4, the killer transistor M32 is turned ON or the switch transistor M33 is turned OFF. Note that, if the temperature-dependent current source 60 has negative temperature characteristics, the output signal of the comparator 62 may be inverted by turning OFF the killer transistor M32 or turning ON the switch transistor M33. Thereby, the second temperature compensation current source 22 can be configured.

By using the above-described first and second temperature compensation current sources 21 and 22 in any combination, all temperature characteristics at threshold temperature, high temperature and low temperature of the light emitting device 10 can be feedforward-controlled. Here, another specific example of the temperature compensation current source 20 of FIG. 1 will be described.

Figure 15:
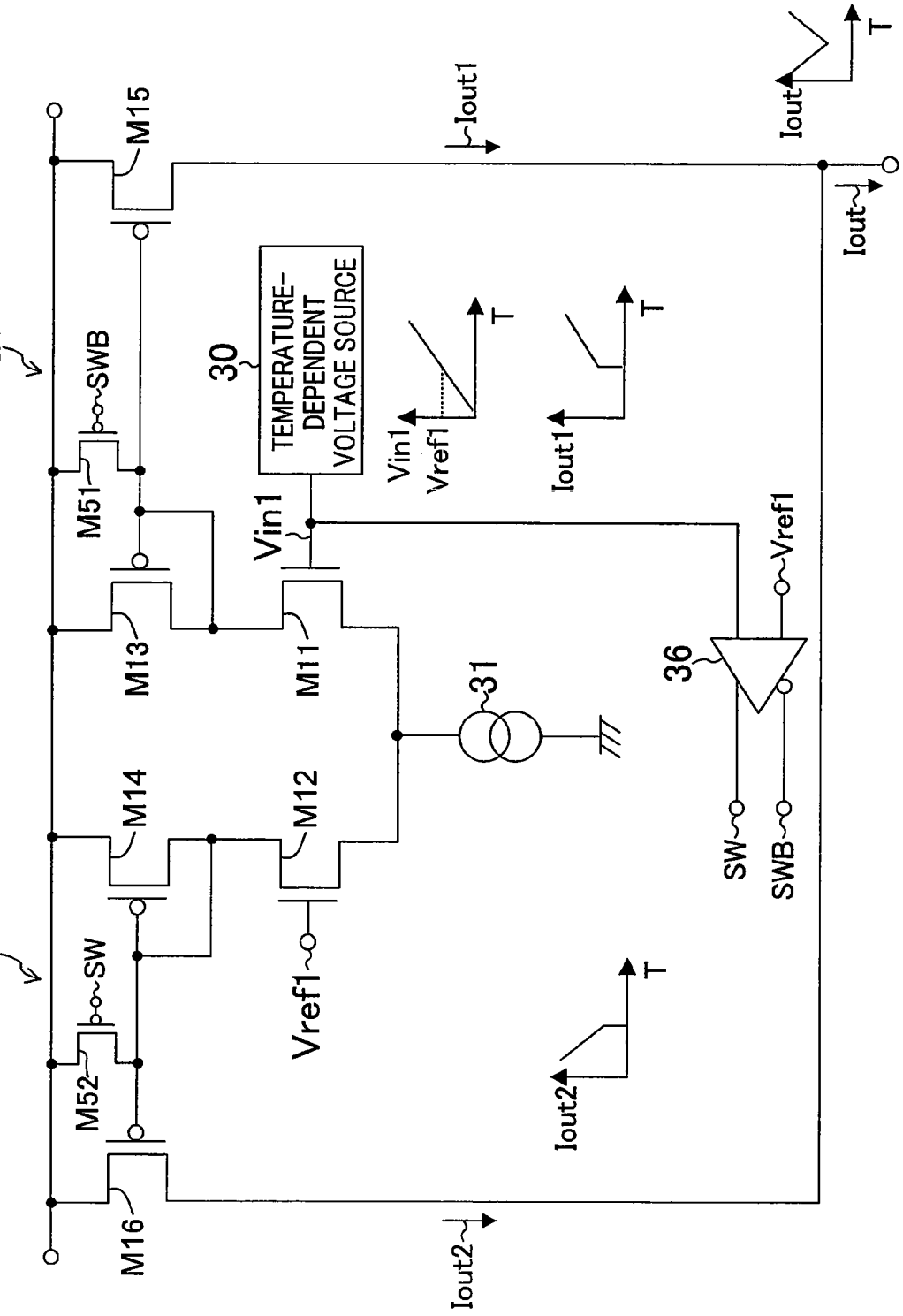
FIG. 15 is a circuit diagram showing an exemplary configuration of the first temperature compensation current source of FIG. 1.

FIG. 15 shows an exemplary configuration of the temperature compensation current source 20 of FIG. 1. The temperature compensation current source 20 of FIG. 15 has a current source 31, differential switch transistors M11 and M12 whose sources are connected to the current source 31, current source transistors M13 and M14 whose drains and gates are connected to the drains of the differential switch transistors M11 and M12, respectively, and whose sources are connected to a power supply, a first current output transistor M15 whose gate is connected to the gate of the current source transistor M13 and whose source is connected to the power supply, a second current output transistor M16 whose gate is connected to the gate of the current source transistor M14 and whose source is connected to the power supply, a first killer transistor M51 whose drain is connected to the gate of the first current output transistor M15 and whose source is connected to the power supply, a second killer transistor M52 whose drain is connected to the gate of the second current output transistor M16 and whose source is connected to the power supply, and a comparator 36 that receives a previously set reference voltage Vref1 and a temperature-dependent voltage Vin1 and outputs differential signals SW and SWB to the gates of the first and second killer transistors M51 and M52.

In this configuration, the reference voltage Vref1 is input to the gate of one of the differential switch transistors M11 and M12, and the temperature-dependent voltage Vin1 is input to the gate of the other. Therefore, in the current source transistor M13, a current does not flow when Vin1 is lower than or equal to the reference voltage (corresponding to a threshold temperature) Vref1, and a current that increases with an increase in temperature flows when Vin1 is higher than or equal to the reference voltage Vref1. In the current source transistor M14, a current does not flow when Vin1 is higher than or equal to the reference voltage (corresponding to the threshold temperature) Vref1, and a current that increases with a decrease in temperature flows when Vin1 is lower than or equal to the reference voltage Vref1. By adding the first and second killer transistors M51 and M52 to this configuration, when the temperature-dependent voltage Vin1 is higher than the reference voltage Vref1, the first killer transistor M51 is turned OFF and the second killer transistor M52 is turned ON, so that a current flowing through the current source transistor M13 is current-mirrored, and a current Iout1 is output from the drain of the first current output transistor M15. On the other hand, when the temperature-dependent voltage Vin1 is lower than the reference voltage Vref1, the first killer transistor M51 is turned ON and the second killer transistor M52 is turned OFF, so that a current flowing through the current source transistor M14 is current-mirrored, and a current Iout2 is output from the drain of the second current output transistor M16. By adding the currents Iout1 and Iout2 flowing through the first and second current output transistors M15 and M16, a temperature-dependent current Iout is output both at high temperature and at low temperature.

Figure 16:
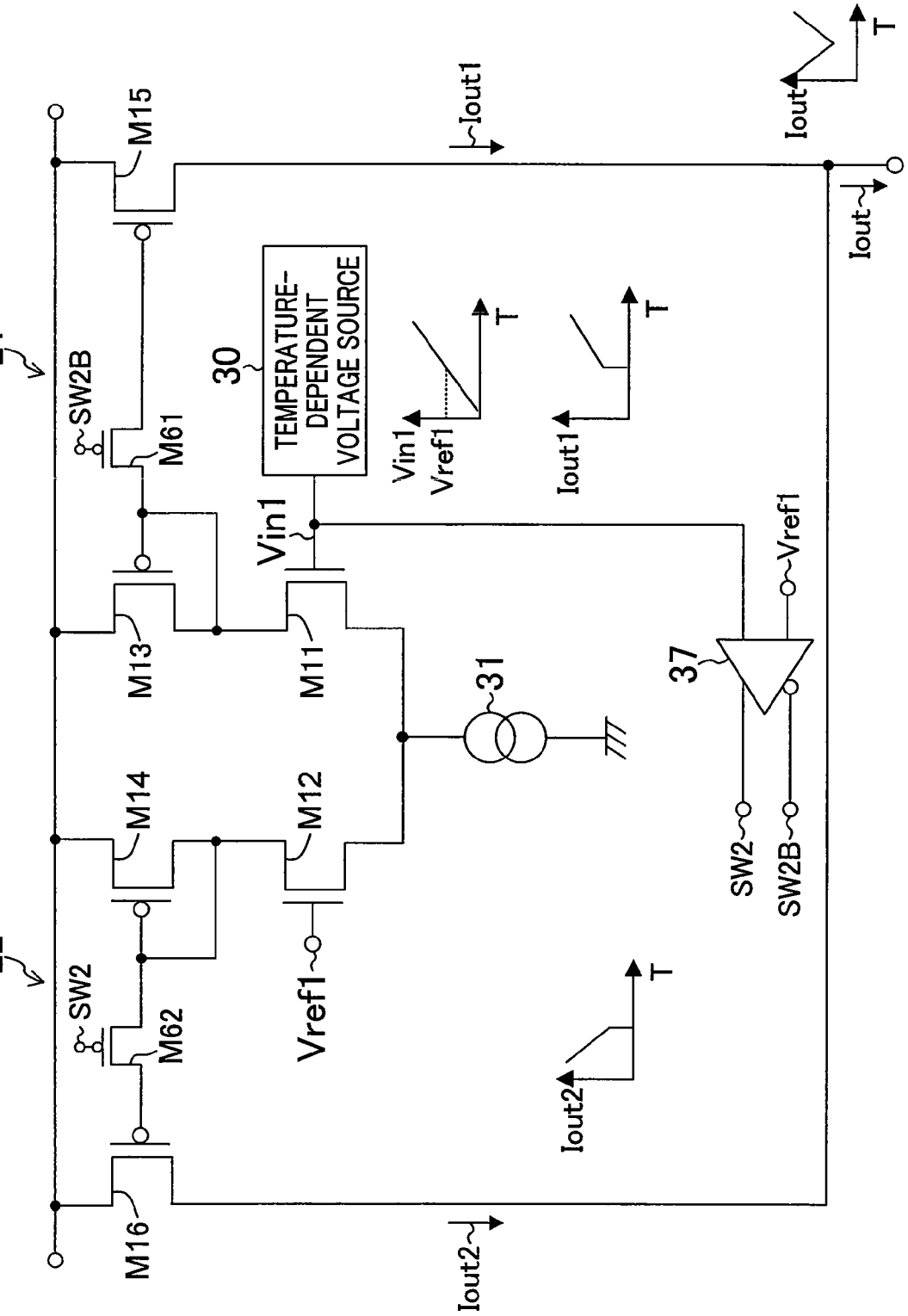
FIG. 16 is a circuit diagram showing a variation of the configuration of FIG. 15.

FIG. 16 shows a variation of the configuration of FIG. 15. In this configuration, first and second switch transistors M61 and M62 are added instead of the first and second killer transistors M51 and M52 of FIG. 15. The basic operation is similar to that of FIG. 15, and therefore, only the switch transistors M61 and M62 will be described.

A temperature compensation current source 20 of FIG. 16 has the first switch transistor M61 whose drain is connected to the gate of a current source transistor M13 and whose source is connected to the gate of a first current output transistor M15, and the second switch transistor M62 whose drain is connected to the gate of a current source transistor M14 and whose source is connected to the gate of a second current output transistor M16. A comparator 37 receives a previously set reference voltage Vref1 and a temperature-dependent voltage Vin1, and outputs differential signals SW2 and SW2B to the gates of the first and second switch transistors M61 and M62.

In this configuration, when the temperature-dependent voltage Vin1 is higher than a reference voltage Vref1, the first switch transistor M61 is turned ON and the second switch transistor M62 is turned OFF, so that a current flowing through the current source transistor M13 is current-mirrored, and a current Iout1 is output from the drain of the first current output transistor M15. When the temperature-dependent voltage Vin1 is lower than the reference voltage Vref1, the first switch transistor M61 is turned OFF and the second switch transistor M62 is turned ON, so that a current flowing the current source transistor M14 is current-mirrored, and a current Iout2 is output from the drain of the second current output transistor M16. By adding the currents Iout1 and Iout2 flowing through the first and second current output transistors M15 and M16, a temperature-dependent current Iout is output both at high temperature and at low temperature.

In the above-described configurations of FIGS. 15 and 16, the single reference voltage Vref1 can be used to compensate for both characteristics at high temperature and characteristics at low temperature of the light emitting device 10, advantageously leading to a simple circuit configuration, a small chip area, and the like.

Note that the comparators 36 and 37 may be a hysteresis comparator so as to avoid an erroneous operation during switching of the comparators 36 and 37.

Further, in FIGS. 15 and 16, if one or a plurality of constant current sources 23 are added to perform addition/subtraction of a constant current, desired characteristics can be corrected with higher precision. Here, the constant current source 23 may be connected to the drain of the current output transistor M15, so that a constant current is added to or subtracted from the whole current. Alternatively, the constant current source 23 may be connected to the drains of the current source transistors M13 and M14, so that addition/subtraction is performed with respect to each or both of the first temperature compensation current source 21 and the second temperature compensation current source 22. Any configuration may be used as long as current characteristics can be obtained with higher precision.

Figure 17:
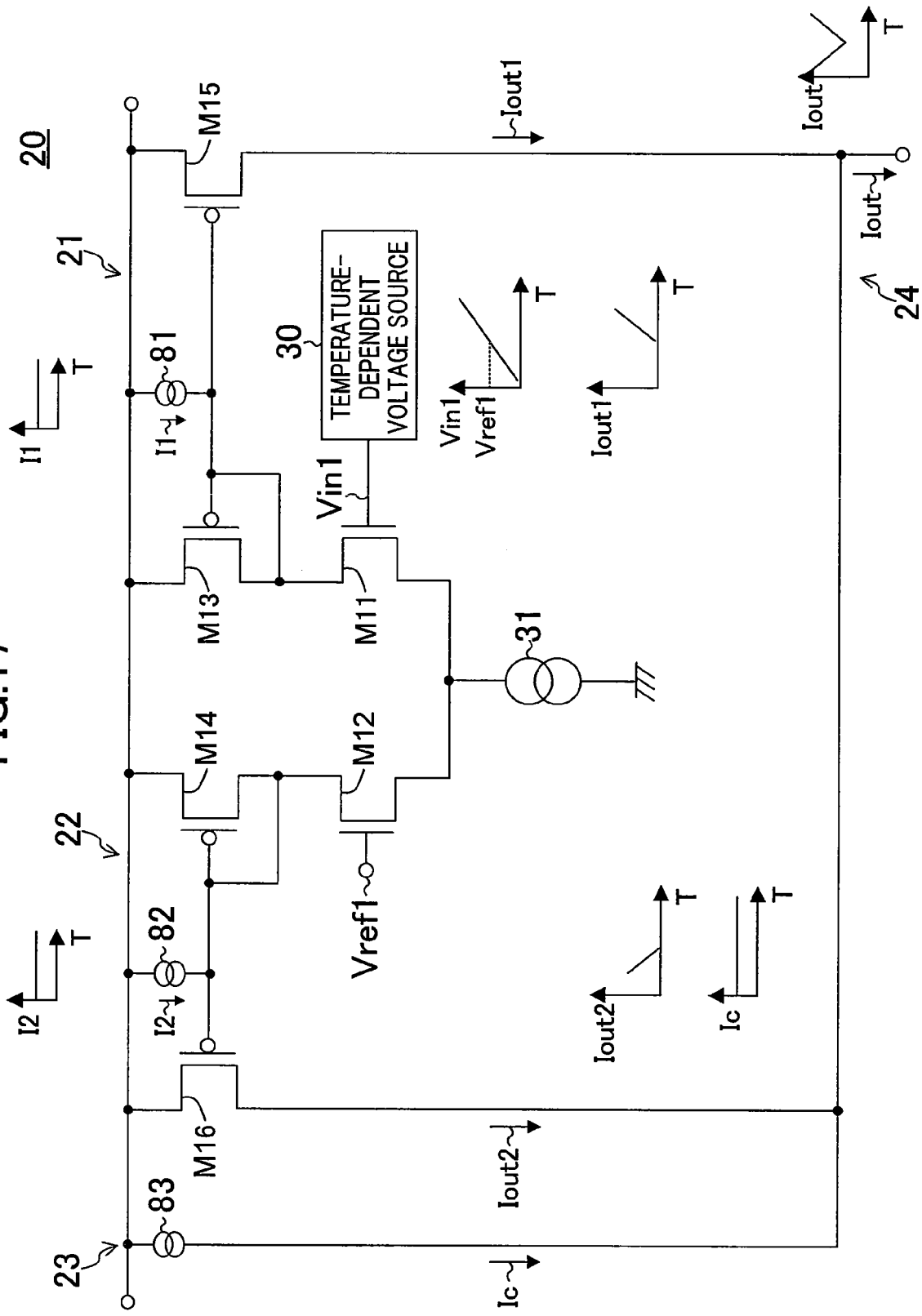
FIG. 17 is a circuit diagram showing another variation of the configuration of FIG. 15.

FIG. 17 shows another variation of the configuration of FIG. 15. In this configuration, two constant current sources 81 and 82 are added instead of the first and second killer transistors M51 and M52 of FIG. 15, and a constant current source 83 corresponding to the constant current source 23 of FIG. 3 is added. The basic operation is similar to that of FIG. 15, and therefore, only the constant current sources 81, 82 and 83 will be here described. Note that a constant current source 31 connected to first and second switch transistors M11 and M12 is referred to as a first constant current source, and the three constant current sources 81, 82 and 83 added in FIG. 17 are referred to as second, third and fourth constant current sources.

A temperature compensation current source 20 of FIG. 17 has the second constant current source 81 connected between the gate of a first current output transistor M15 and a power supply, the third constant current source 82 connected between the gate of a second current output transistor M16 and the power supply, and the fourth constant current source 83 connected to the power supply.

In this configuration, when a current flowing through the first switch transistor M11 is larger than a current I1 flowing through the second constant current source 81, a temperature-dependent current is output as a current Iout1 from the drain of the first current output transistor M15. When a current flowing through the second switch transistor M12 is larger than a current I2 flowing through the third constant current source 82, a temperature-dependent current is output as a current Iout2 from the drain of the second current output transistor M16. By adding a current Ic flowing through the fourth constant current source 83 as a current at room temperature to the currents Iout1 and Iout2 flowing through the first and second current output transistors M15 and M16, a desired temperature-dependent current Iout is output at room temperature, at high temperature, and at low temperature.

Here, by setting each of the current values I1 and I2 of the second and third constant current sources 81 and 82 to be one half of a current value of the first constant current source 31, characteristics can be switched between at high temperature and at low temperature, where there is an accurate threshold therebetween. Particularly, in this case, current precision is required, and therefore, all input/output of a current is preferably performed by a cascode configuration.

In the above-described configuration of FIG. 17, a comparator is not required, and the single reference voltage Vref1 can be used to compensate for both characteristics at high temperature and characteristics at low temperature of the light emitting device 10, advantageously leading to a simple circuit configuration, a small chip area, and the like.

Here, a variation in current can be easily set at high temperature and at low temperature separately by changing the mirror ratio of a current mirror.

Further, in the configuration of FIG. 17, the constant current sources 81, 82 and 83 are each a single source. Alternatively, a plurality of constant current sources may be provided at each portion to perform addition/subtraction of their constant currents, thereby correcting characteristics with higher precision to obtain desired characteristics. Any configuration may be used as long as current characteristics can be obtained with higher precision.

Although it has been assumed in FIGS. 15 to 17 that the differential switch transistors M11 and M12 have an N-channel configuration, the differential switch transistors M11 and M12 may have a P-channel configuration and the other circuits may have a reversed circuit configuration.

Also, in FIGS. 15 to 17, in order to change slopes of characteristic curves of temperature dependency (temperature-current coefficients) of the first and second temperature compensation current sources 21 and 22, resistances 32 and 33 or variable resistances 34 and 35 may be added between the respective sources of the differential switch transistors M11 and M12, and the constant current source 31, as in the configuration of FIG. 10 or 11.

Further, a plurality of current sources may be added to the circuit configurations of FIGS. 15 to 17 to perform addition/subtraction of a temperature-dependent current and a constant current so as to perform high-precision temperature compensation, such as changing an absolute value, changing temperature dependency, or the like. Also, a current source circuit section may have a cascode configuration.

INDUSTRIAL APPLICABILITY

As described above, the optical transmission circuit of the present invention has a temperature compensation function applicable to a light emitting device (e.g., a VCSEL) having different temperature characteristics at high temperature and low temperature, and can be used in general optical communication apparatuses.

The invention claimed is:
1. An optical transmission circuit comprising:
a light emitting device having different temperature characteristics at low temperature and high temperature;
differential switch transistors for driving the light emitting device, the differential switch transistors having sources connected to each other and drains connected to the light emitting device and a power supply, respectively;
a bias current source for causing a bias current to flow through the light emitting device;
a modulated current source for causing a modulated current to flow through the light emitting device; and
a temperature compensation current source for controlling currents of the bias current source and the modulated current source so as to compensate for both temperature characteristics at low temperature and temperature characteristics at high temperature of the light emitting device,
wherein the light emitting device is a surface emitting laser device, the surface emitting laser device having characteristics in which a threshold current causing a start of a current-light conversion increases and a current-light conversion efficiency decreases at the high temperature, and the threshold current causing the start of the current-light conversion increases and a current-light conversion efficiency decreases at the low temperature, and the temperature compensation current source has:

a first temperature compensation current source for compensating for the high-temperature characteristics of the light emitting device; and a second temperature compensation current source for compensating for the low-temperature characteristics of the light emitting device, the temperature compensation current source changing characteristics of the bias current source and the modulated current source depending on the temperature such that the surface emitting laser device is compensated and a predetermined optical output power is constantly output.

2. The optical transmission circuit of claim 1, wherein the first temperature compensation current source causes a constant current to flow when temperature is lower than or equal to a first threshold, and causes a current increasing with an increase in temperature when temperature is higher than the first threshold, and the second temperature compensation current source causes a constant current to flow when temperature is higher than or equal to a second threshold, and causes a current increasing with a decrease in temperature when temperature is lower than the second threshold.

3. The optical transmission circuit of claim 1, wherein the temperature compensation current source further has:
   a constant current source for causing a constant current to invariably flow; and
   an addition/subtraction circuit for performing addition/subtraction of three currents that are output currents of the first and second temperature compensation current sources and an output current of the constant current source.

4. The optical transmission circuit of claim 3, wherein the first temperature compensation current source causes a current not to flow when temperature is lower than or equal to a first threshold, and causes a current increasing with an increase in temperature to flow when temperature is higher than or equal to the first threshold, and the second temperature compensation current source causes a current not to flow when temperature is higher than or equal to a second threshold, and causes a current increasing with a decrease in temperature when temperature is lower than the second threshold.

5. The optical transmission circuit of claim 1, wherein the first or second temperature compensation current source has:
   a constant current source;
   differential switch transistors having sources connected to the constant current source;
   current source transistors having drains and gates connected to respective drains of the differential switch transistors, and sources connected to a power supply;
   a current output transistor having a gate connected to the gate of one of the current source transistors, and a source connected to a power supply; and
   a temperature-dependent voltage source for outputting a temperature-dependent voltage,
wherein a previously set reference voltage is input to a gate of one of the differential switch transistor, and an output voltage of the temperature-dependent voltage source is input to a gate of the other, so that a desired current is output from a drain of the current output transistor.

6. The optical transmission circuit of claim 5, wherein the temperature-dependent voltage source has:
   a temperature-dependent current source for outputting a temperature-dependent current; and
   a resistance connected to the temperature-dependent current source;
wherein a temperature-dependent voltage is output from a connection end of the temperature-dependent current source and the resistance.

7. The optical transmission circuit of claim 5, wherein the temperature-dependent voltage source has:
   a current source transistor;
   an operational amplifier having inputs for receiving a previously set reference voltage and a source voltage of the current source transistor, and an output connected to a gate of the current source transistor;
   a resistance having an end connected to a source of the current source transistor; and
   a diode connected between the other end of the resistance and a ground,
wherein a temperature-dependent voltage is output from a connection end of the diode and the resistance.

8. The optical transmission circuit of claim 6, wherein the temperature-dependent current source has:
   a current source transistor;
   an operational amplifier having inputs for receiving a previously set reference voltage and a source voltage of the current source transistor, and an output connected to a gate of the current source transistor;
   a resistance having an end connected to a source of the current source transistor; and
   a diode connected between the other end of the resistance and a ground,
wherein a temperature-dependent current is output from a drain of the current source transistor.

9. The optical transmission circuit of claim 5, wherein the first or second temperature compensation current source further has:
   a resistance connected between the source of each of the differential switch transistors and the constant current source.

10. The optical transmission circuit of claim 5, wherein the first or second temperature compensation current source further has:
    a variable resistance connected between the source of each of the differential switch transistors and the constant current source.

11. The optical transmission circuit of claim 1, wherein the first or second temperature compensation current source has:
    a temperature-dependent current source for outputting a temperature-dependent current;
    a current mirror transistor having a drain and a gate connected to the temperature-dependent current source, and a source connected to a power supply; and
    a constant current source connected between the drain of the current mirror transistor and a power supply,
wherein, when a current flowing through the temperature-dependent current source is larger than a current flowing through the constant current source, a temperature-dependent current flows through the current mirror transistor.

12. The optical transmission circuit of claim 11, wherein the temperature-dependent current source has:
    a current source transistor;
    an operational amplifier having inputs for receiving a previously set reference voltage and a source voltage of the current source transistor, and an output connected to a gate of the current source transistor;
    a resistance having an end connected to a source of the current source transistor; and
    a diode connected between the other end of the resistance and a ground, wherein a temperature-dependent current is output from a drain of the current source transistor.

13. The optical transmission circuit of claim 1, wherein the first or second temperature compensation current source has:
a temperature-dependent current source for outputting a temperature-dependent current;
a current mirror transistor having a drain and a gate connected to the temperature-dependent current source, and a source connected to a power supply;
a killer transistor having a drain connected to the drain of the current mirror transistor, and a source connected to a power supply; and
a comparator having inputs for receiving a previously set reference voltage and a temperature-dependent voltage, and having an output connected to a gate of the killer transistor,
wherein, when the temperature-dependent voltage is smaller than the reference voltage, the killer transistor is turned OFF, so that a temperature-dependent current is output from the current mirror transistor.

14. The optical transmission circuit of claim 13, wherein the temperature-dependent current source has:
a current source transistor;
an operational amplifier having inputs for receiving a previously set reference voltage and a source voltage of the current source transistor, and an output connected to a gate of the current source transistor;
a resistance having an end connected to a source of the current source transistor; and
a diode between the other end of the resistance and a ground,
wherein a temperature-dependent current is output from a drain of the current source transistor.

15. The optical transmission circuit of claim 1, wherein the first or second temperature compensation current source has:
a temperature-dependent current source for outputting a temperature-dependent current;
a current mirror transistor having a drain and a gate connected to the temperature-dependent current source, and a source connected to a power supply;
a switch transistor having a drain connected to the drain of the current mirror transistor; and
a comparator having inputs for receiving a previously set reference voltage and a temperature-dependent voltage, and an output connected to a gate of the switch transistor,
wherein, when the temperature-dependent voltage is smaller than the reference voltage, the switch transistor is turned ON, so that a temperature-dependent current is output from the current mirror transistor.

16. The optical transmission circuit of claim 15, wherein the temperature-dependent current source has:
a current source transistor;
an operational amplifier having inputs for receiving a previously set reference voltage and a source voltage of the current source transistor, and an output connected to a gate of the current source transistor;
a resistance having an end connected to a source of the current source transistor; and
a diode connected between the other end of the resistance and a ground,
wherein a temperature-dependent current is output from a drain of the current source transistor.

17. The optical transmission circuit of claim 1, wherein the temperature compensation current source has:
a constant current source;
differential switch transistors having sources connected to the constant current source;
current source transistors having drains and gates connected to respective drains of the differential switch transistors, and sources connected to a power supply;
a first current output transistor having a gate to the gate of one of the current source transistors, and a source connected to a power supply;
a second current output transistor having a gate connected to the gate of the other current source transistor, and a source connected to a power supply;
a first killer transistor having a drain connected to the gate of the first current output transistor, and a source connected to a power supply;
a second killer transistor having a drain connected to the gate of the second current output transistor, and a source connected to a power supply; and
a comparator for receiving a previously set reference voltage and a temperature-dependent voltage, and outputting a differential signal to the gates of the first and second killer transistors,
wherein the reference voltage is input to a gate of one of the differential switch transistors, and the temperature-dependent voltage is input to a gate of the other, and
when the temperature-dependent voltage is higher (or lower) than the reference voltage, the first killer transistor is turned OFF (or ON) and the second killer transistor is turned ON (or OFF), and when the temperature-dependent voltage is lower (or higher) than the reference voltage, the first killer transistor is turned ON (or OFF) and the second killer transistor is turned OFF (or ON), and currents flowing through the first and second current output transistors are added and the result is output.

18. The optical transmission circuit of claim 1, wherein the temperature compensation current source has:
a constant current source;
differential switch transistors having sources connected to the constant current source;
current source transistors having drains and gates connected to respective drains of the differential switch transistors, and sources connected to a power supply;
a first current output transistor having a gate connected to the gate of one of the current source transistors, and a source connected to a power supply;
a second current output transistor having a gate connected to the gate of the other current source transistor, and a source connected to a power supply;
a first switch transistor having a drain connected to the gate of one of the current source transistors, and a source connected to the gate of the first current output transistor;
a second switch transistor having a drain connected to the gate of the other current source transistor, and a source connected to the gate of the second current output transistor; and
a comparator for receiving a previously set reference voltage and a temperature-dependent voltage, and outputting a differential signal to the gates of the first and second switch transistors,
wherein the reference voltage is input to a gate of one of the differential switch transistors, and the temperature-dependent voltage is input to a gate of the other, and
when the temperature-dependent voltage is higher (or lower) than the reference voltage, the first switch transistor is turned ON (or OFF) and the second switch transistor is turned OFF (or ON), and when the temperature-dependent voltage is lower (or higher) than the reference voltage, the first switch transistor is turned OFF (or ON) and the second switch transistor is turned ON (or OFF), and currents flowing through the first and second current output transistors are added and the result is output.

19. The optical transmission circuit of claim 1, wherein the temperature compensation current source has:
 a first constant current source;
 differential switch transistors having sources connected to the first constant current source;
 current source transistors having drains and gates connected to respective drains of the differential switch transistors, and sources connected to a power supply;
 a first current output transistor having a gate connected to the gate of one of the current source transistors, and a source connected to a power supply;
 a second current output transistor having a gate connected to the gate of the other current source transistor, and a source connected to a power supply;
 a second constant current source connected between the gate of the first current output transistor and a power supply;
 a third constant current source connected between the gate of the second current output transistor and a power supply; and
 a fourth constant current source connected to a power supply,
wherein, when a current flowing through the first switch transistor is larger than a current flowing through the second constant current source, a temperature-dependent current flows through the first current output transistor,
when a current flowing through the second switch transistor is larger than a current flowing through the third constant current source, a temperature-dependent current flows through the second current output transistor, and
currents flowing through the first and second current output transistors and a current flowing through the fourth constant current source are added and the result is output.

20. The optical transmission circuit of claim 19, wherein current values of the second and third constant current sources are one half of a current value of the first constant current source.

\* \* \* \* \*